(12) United States Patent
Lin et al.

(10) Patent No.: US 12,051,652 B2
(45) Date of Patent: Jul. 30, 2024

(54) PACKAGE STRUCTURE AND METHOD OF FABRICATING THE SAME

(71) Applicant: Taiwan Semiconductor Manufacturing Company, Ltd., Hsinchu (TW)

(72) Inventors: Shih-Ting Lin, Taipei (TW); Chi-Hsi Wu, Hsinchu (TW); Chen-Hua Yu, Hsinchu (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 206 days.

(21) Appl. No.: 17/857,066

(22) Filed: Jul. 4, 2022

(65) Prior Publication Data

US 2022/0336364 A1    Oct. 20, 2022

Related U.S. Application Data

(62) Division of application No. 16/927,992, filed on Jul. 14, 2020, now Pat. No. 11,417,606.

(Continued)

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ... H01L 25/0652; H01L 25/50; H01L 21/561; H01L 21/4857; H01L 23/3135;
(Continued)

(56) References Cited

U.S. PATENT DOCUMENTS 9,000,584 B2    4/2015   Lin et al.
9,048,222 B2    6/2015   Hung et al.
(Continued)

*Primary Examiner* — Kyoung Lee
*Assistant Examiner* — Christina A Sylvia
(74) *Attorney, Agent, or Firm* — JCIPRNET

(57) ABSTRACT

A package structure includes a plurality of semiconductor dies, an insulating encapsulant, a redistribution layer and a plurality of connecting elements. The insulating encapsulant is encapsulating the plurality of semiconductor dies. The redistribution layer is disposed on the insulating encapsulant in a build-up direction and electrically connected to the plurality of semiconductor dies, wherein the redistribution layer includes a plurality of conductive lines, a plurality of conductive vias and a plurality of dielectric layers alternately stacked, and a lateral dimension of the plurality of conductive vias increases along the build-up direction. The connecting elements are disposed in between the redistribution layer and the semiconductor dies, wherein the connecting elements includes a body portion joined with the semiconductor dies and a via portion joined with the redistribution layer, wherein a lateral dimension of the via portion decreases along the build-up direction.

20 Claims, 31 Drawing Sheets

PK5

Related U.S. Application Data

(60) Provisional application No. 62/906,113, filed on Sep. 26, 2019.

(51) Int. Cl.
*H01L 21/56* (2006.01)
*H01L 21/683* (2006.01)
*H01L 23/00* (2006.01)
*H01L 23/31* (2006.01)

(52) U.S. Cl.
CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 2221/68372* (2013.01); *H01L 2224/214* (2013.01)

(58) Field of Classification Search
CPC ............. H01L 23/5383; H01L 23/3107; H01L 23/49811; H01L 2225/06572
See application file for complete search history.

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2020/0105695 A1* | 4/2020 | Hu .......................... H01L 24/09 |

* cited by examiner

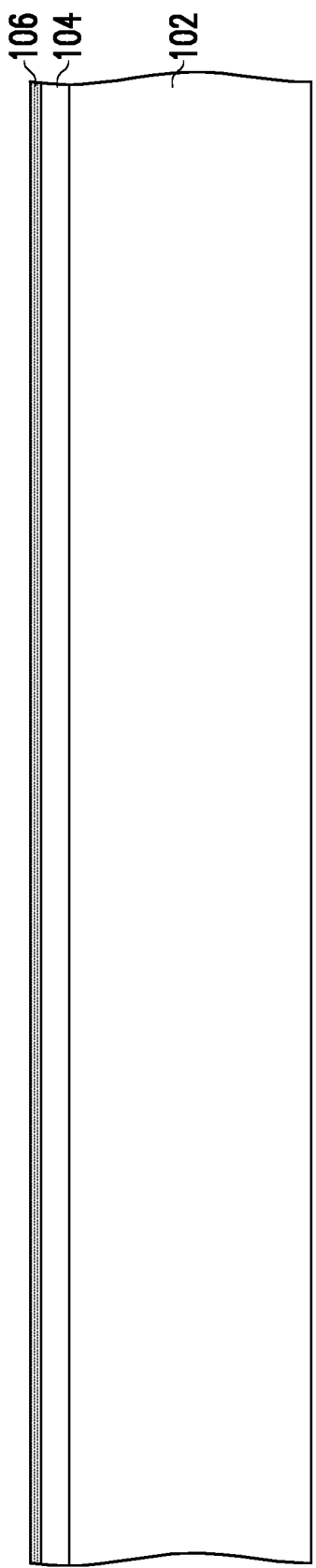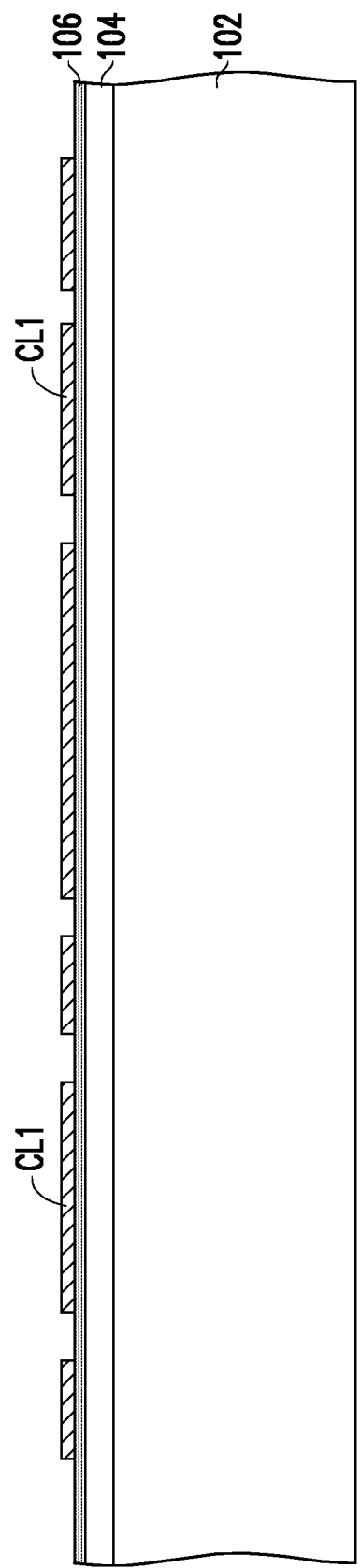

PACKAGE STRUCTURE AND METHOD OF FABRICATING THE SAME

CROSS-REFERENCE TO RELATED APPLICATION

This application is a divisional application of U.S. application Ser. No. 16/927,992, filed on Jul. 14, 2020, now allowed. The prior application Ser. No. 16/927,992 claims the priority benefit of U.S. provisional application Ser. No. 62/906,113, filed on Sep. 26, 2019. The entirety of the above-mentioned patent application is hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Developments of the three-dimensional integration technology for wafer level packaging are underway to satisfy the demands of size reduction, high performance interconnects and heterogeneous integration for high-density integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1I are schematic sectional views of various stages in a method of fabricating a package structure according to some exemplary embodiments of the present disclosure.

DETAILED DESCRIPTION

Figure 1C:
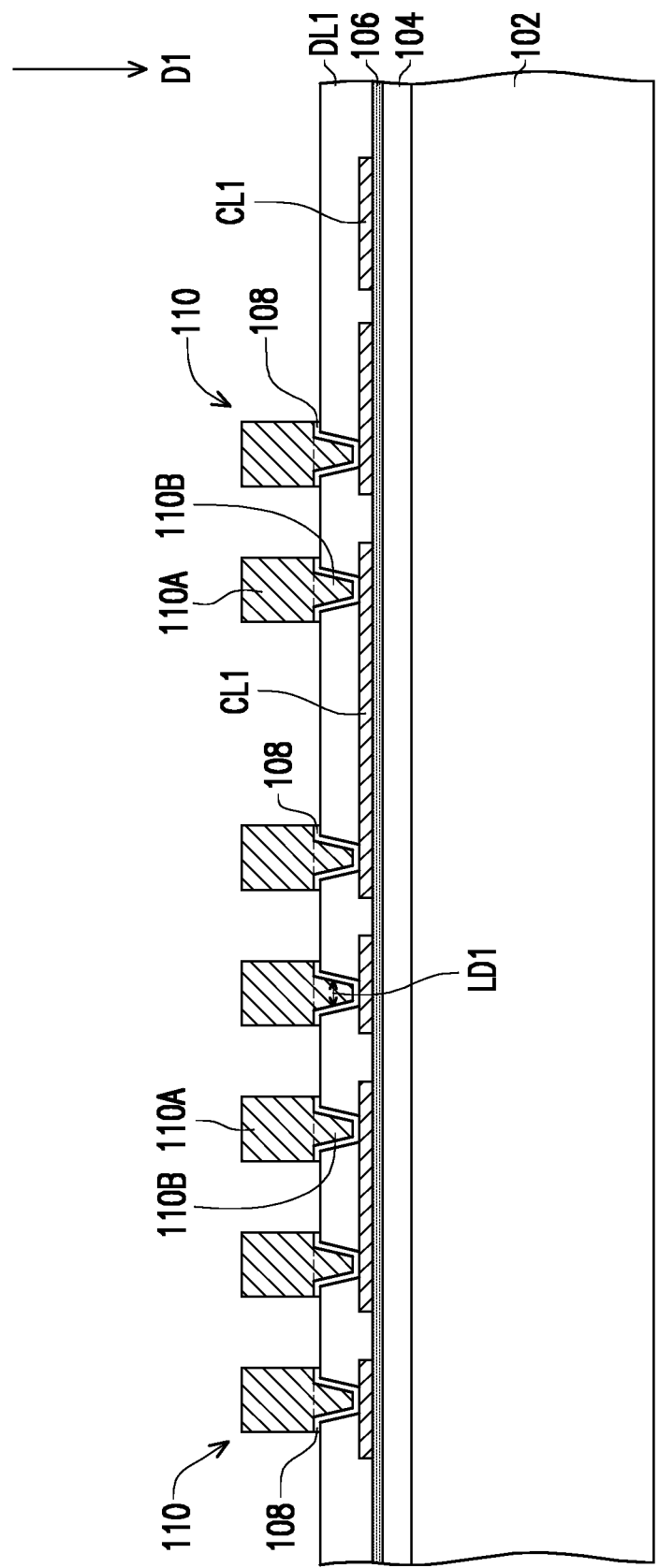

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In package structures, when semiconductor dies having different heights or thicknesses are used, due to the grinding/planarization process used to compensate for the height variation, various reliability issues such as cracks in the molding compound (encapsulant), cracks in the redistribution layer, or collapse of the redistribution layer may occur. In some embodiments of the present disclosure, conductive bumps and pillars are used to compensate for the die height variation. Therefore, molding and grinding on the conductive posts of the semiconductor dies may be reduced. As a result, cracks in the molding compound (encapsulant) and cracks in the redistribution layer may be further reduced. Furthermore, the conductive bumps and pillars may be used to gain a large standoff while keeping low pitch for heterogenous bonding, thus improving the reliability window of the package structures.

FIG. 1A to FIG. 1I are schematic sectional views of various stages in a method of fabricating a package structure according to some exemplary embodiments of the present disclosure. Referring to FIG. 1A, a first carrier 102 is provided. In some embodiments, the first carrier 102 may be a glass carrier or any suitable carrier for carrying a semiconductor wafer or a reconstituted wafer for the manufacturing method of the package structure. In some embodiments, the first carrier 102 is coated with a debond layer 104.

The material of the debond layer 104 may be any material suitable for bonding and de-bonding the first carrier 102 from the above layer(s) or any wafer(s) disposed thereon.

In some embodiments, the debond layer 104 may include a dielectric material layer made of a dielectric material including any suitable polymer-based dielectric material (such as benzocyclobutene ("BCB"), polybenzoxazole ("PBO")). In an alternative embodiment, the debond layer 104 may include a dielectric material layer made of an epoxy-based thermal-release material, which loses its adhesive property when heated, such as a light-to-heat-conversion (LTHC) release coating film. In a further alternative embodiment, the debond layer 104 may include a dielectric material layer made of an ultra-violet (UV) glue, which loses its adhesive property when exposed to UV lights. In certain embodiments, the debond layer 104 may be dispensed as a liquid and cured, or may be a laminate film laminated onto the first carrier 102, or may be the like. The top surface of the debond layer 104, which is opposite to a bottom surface contacting the first carrier 102, may be levelled and may have a high degree of coplanarity. In certain embodiments, the debond layer 104 is, for example, a LTHC layer with good chemical resistance, and such layer enables room temperature de-bonding from the first carrier 102 by applying laser irradiation, however the disclosure is not limited thereto.

In an alternative embodiment, a buffer layer (not shown) may be coated on the debond layer 104, where the debond layer 104 is sandwiched between the buffer layer and the first carrier 102, and the top surface of the buffer layer may further provide a high degree of coplanarity. In some embodiments, the buffer layer may be a dielectric material layer. In some embodiments, the buffer layer may be a polymer layer which made of polyimide, PBO, BCB, or any other suitable polymer-based dielectric material. In some embodiments, the buffer layer may be Ajinomoto Buildup Film (ABF), Solder Resist film (SR), or the like. In other words, the buffer layer is optional and may be omitted based on the demand, so that the disclosure is not limited thereto.

In some embodiments, a seed layer 106 may be formed on the debond layer 104 or on the buffer layer (if present). In some embodiments, the seed layer 106 is a planar seed layer with a high degree of coplanarity. In certain embodiments, the seed layer 106 may be a titanium/copper composited layer. However, the disclosure is not limited thereto, and other types of seed layers may be suitably used.

Referring to FIG. 1B, after forming the seed layer 106, a first conductive line CL1 is formed over the seed layer 106. In some embodiments, the first conductive line CL1 may be made of conductive materials formed by electroplating or deposition, such as aluminum, titanium, copper, nickel, tungsten, and/or alloys thereof, which may be patterned using a photolithography and etching process. In some embodiments, the first conductive line CL1 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. In some embodiments, the first conductive line CL1 is formed to cover portions of the seed layer 106, while some other portions of the seed layer 106 is exposed.

Referring to FIG. 1C, in a next step, a first dielectric layer DL1 is formed to cover the first conductive line CL1. In certain embodiments, the material of the first dielectric layer DL1 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the first dielectric layer DL1 may be formed by suitable fabrication techniques such as spin-on coating, chemical vapor deposition (CVD), plasma-enhanced chemical vapor deposition (PECVD) or the like. The disclosure is not limited thereto.

As illustrated in FIG. 1C, the first dielectric layer DL1 is patterned to have a plurality of openings that expose a surface of the first conductive line CL1. In some embodiments, a connecting seed layer 108 is formed within the plurality of openings and being electrically connected to the first conductive line CL1. The connecting seed layer 108 may be similar to a material used for the seed layer 106. Subsequently, a plurality of connecting elements 110 is formed on the first dielectric layer DL1 and in the plurality of openings. In certain embodiments, the connecting elements 110 is formed on and in physical contact with the connecting seed layer 108. Furthermore, the connecting elements 110 may be electrically connected to the first conductive line CL1 through the connecting seed layer 108.

As further illustrated in FIG. 1C, in some embodiments, the plurality of connecting elements 110 includes a body portion 110A and a via portion 110B. In some embodiments, the via portion 110B is joined with the first conductive line CL1 through the connecting seed layer 108. In certain embodiments, the via portion 110B is located in between the body portion 110A and the connecting seed layer 108. Furthermore, in some embodiments, a lateral dimension LD1 of the via portion 110B decreases along a first direction D1 of the package structure.

Figure 1D:
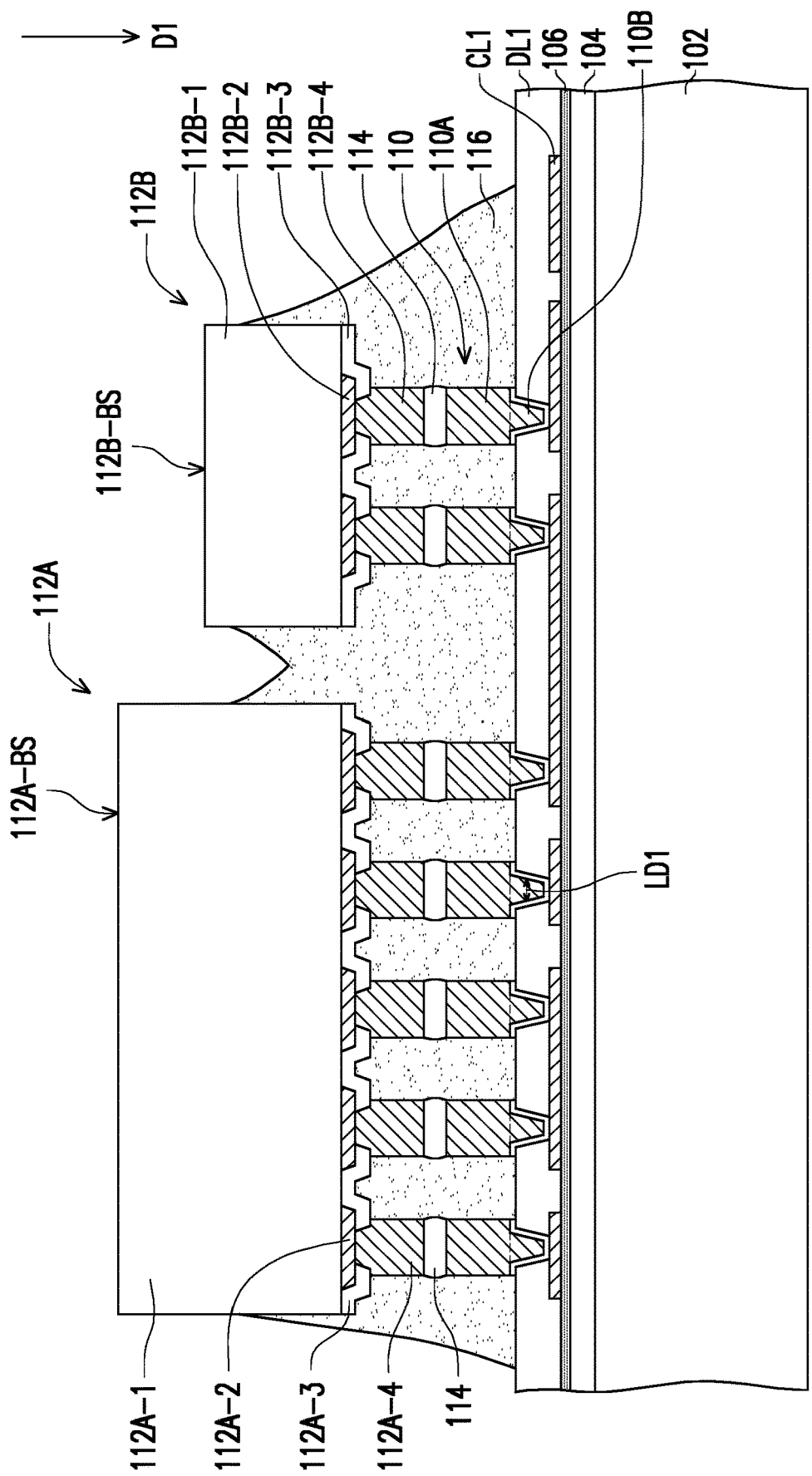

Referring to FIG. 1D, after forming the connecting elements 110, a first semiconductor die 112A and a second semiconductor die 112B are disposed on the plurality of connecting elements 110. For example, the first semiconductor die 112A and the second semiconductor die 112B are disposed on the body portion 110A of the connecting elements 110 through flip-chip bonding. In certain embodiments, the first semiconductor die 112A and the second semiconductor die 112B are electrically connected to the connecting elements 110 through a plurality of conductive bumps 114. For example, the conductive bumps 114 are solder bumps, lead-free solder bumps, micro bumps or the like. Although only two semiconductor dies (112A and 112B) are illustrated herein, it should be noted that the number of semiconductor dies bonded onto the connecting elements 110 is not limited thereto, and this may be adjusted based on requirements. In the illustrated embodiment, a height of the first semiconductor die 112A may be different from a height of the second semiconductor die 112B. For example, the height of the first semiconductor die 112A is greater than the height of the second semiconductor die 112B.

In some embodiments, each of the first semiconductor die 112A and the second semiconductor die 112B includes a semiconductor substrate (first semiconductor substrate 112A-1/second semiconductor substrate 112B-1), a plurality of conductive pads (first conductive pads 112A-2/second conductive pads 112B-2), a passivation layer (first passivation layer 112A-3/second passivation layer 112B-3) and a plurality of conductive posts (first conductive posts 112A-4/second conductive posts 112B-4).

As illustrated in FIG. 1D, the plurality of conductive pads (112A-2/112B-2) is disposed on the semiconductor substrate (112A-1/112B-1). The passivation layer (112A-3/112B-3) is formed over the semiconductor substrate (112A-1/112B-1) and has openings that partially expose the conductive pads (112A-2/112B-2) on the semiconductor substrate (112A-1/112B-1). The semiconductor substrate (112A-1/112B-1) may be a bulk silicon substrate or a silicon-on-insulator (SOI) substrate, and further includes active components (e.g., transistors or the like) and optionally passive components (e.g., resistors, capacitors, inductors or the like) formed therein. The conductive pads (112A-2/112B-2) may be aluminum pads, copper pads or other suitable metal pads. The passivation layer (112A-3/112B-3) may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer (112A-3/112B-3). The post-passivation layer covers the passivation layer (112A-3/112B-3) and has a plurality of contact openings. The conductive pads (112A-2/112B-2) are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts (112A-4/112B-4) are formed on the conductive pads (112A-2/112B-2) by plating. In some embodiments, the first conductive posts 112A-4 and the second conductive posts 112B-4 of the first and second semiconductor dies 112A and 112B are electrically connected to the connecting elements 110 through the conductive bumps 114. In other words, the first conductive posts 112A-4 and the second conductive posts 112B-4 may be physically joined to the conductive bumps 114 for electrical connection.

In some embodiments, the first semiconductor die 112A and the second semiconductor die 112B may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto. In some embodiments, the first semiconductor die 112A and the second semiconductor die 112B are different type of semiconductor dies. In certain embodiments, the first semiconductor die 112A and the second semiconductor die 112B may be the same type of semiconductor dies.

Furthermore, in the illustrated embodiment, after disposing the first semiconductor die 112A and the second semiconductor die 112B onto the connecting elements 110, an underfill structure 116 is formed on the first dielectric layer DL1 to cover the body portions 110A of the connecting elements 110, and to partially cover the first semiconductor die 112A and the second semiconductor die 112B. In some embodiments, the underfill structure 116 surrounds the conductive posts (112A-4/112B-4) of the first and second semiconductor dies 112A and 112B, and further surrounds the conductive bumps 114. In certain embodiments, the underfill structure 116 fills up the spaces in between adjacent connecting elements 110, and fills up the spaces between adjacent conductive posts (112A-4/112B-4). In some embodiments, the underfill structure 116 covers sidewalls of the first semiconductor die 112A and the second semiconductor die 112B, while the backside surfaces 112A-BS and 112B-BS of the first and second semiconductor dies 112A and 112B are revealed. In certain embodiments, a width of the underfill structure 116 increases along the first direction D1.

Figure 1E:
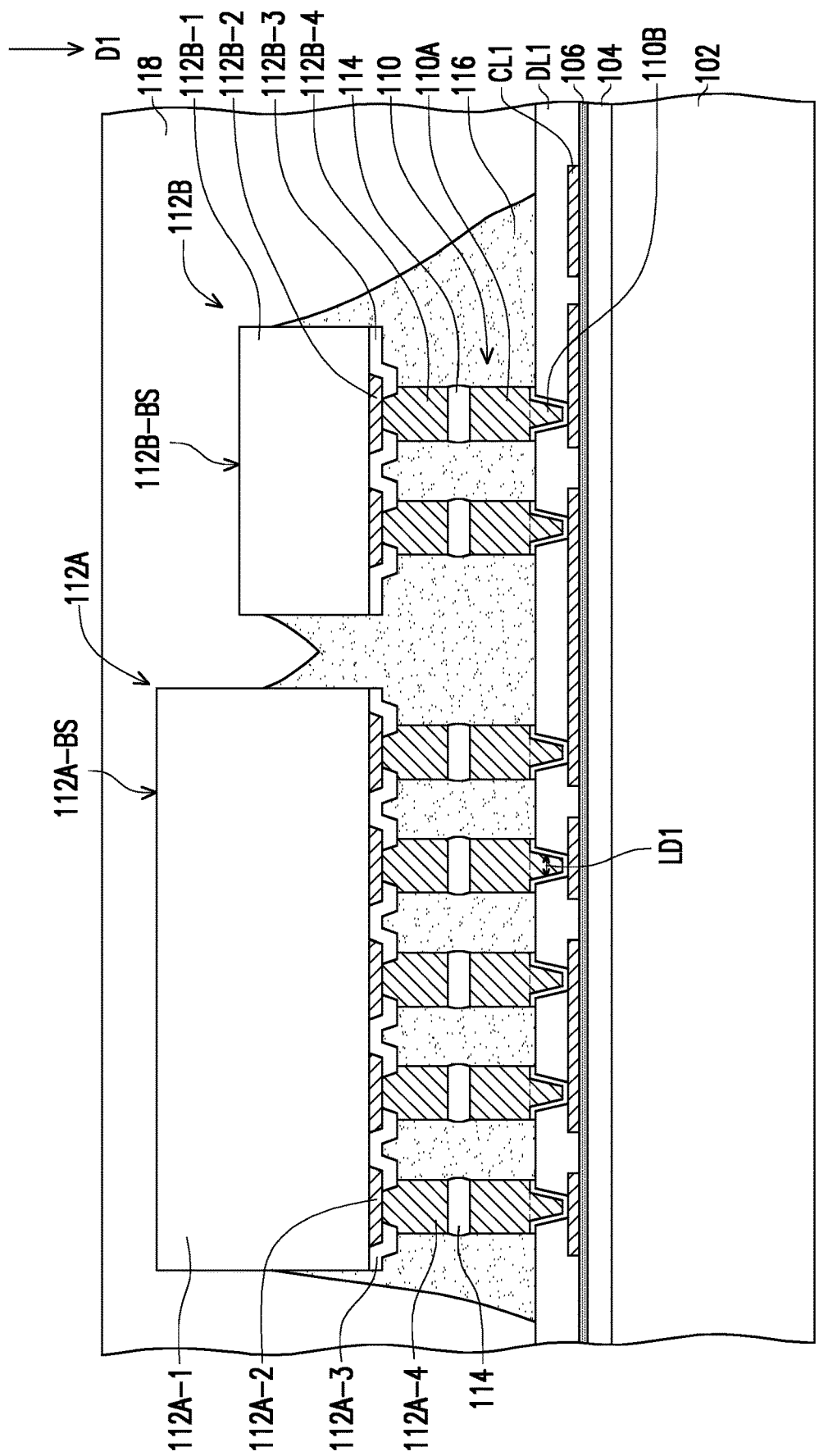

Referring to FIG. 1E, in a next step, an insulting material 118 is formed on the first dielectric layer DL1 to encapsulate the first semiconductor die 112A, the second semiconductor die 112B and to surround the plurality of connecting elements 110. In some embodiments, the insulating material 118 further surrounds the underfill structure 116. In some embodiments, the insulating material 118 is formed through, for example, a compression molding process, filling up the gaps between the first semiconductor die 112A and the second semiconductor die 112B. In certain embodiments, the insulating material 118 also fills up the gaps in the underfill structure 116. At this stage, the first semiconductor die 112A and the second semiconductor die 112B are encapsulated and well protected by the insulating material 118. In other words, the first semiconductor die 112A and the second semiconductor die 112B are not revealed.

In some embodiments, the insulating material 118 includes polymers (such as epoxy resins, phenolic resins, silicon-containing resins, or other suitable resins), dielectric materials having low permittivity (Dk) and low loss tangent (Df) properties, or other suitable materials. In an alternative embodiment, the insulating material 118 may include an acceptable insulating encapsulation material. In some embodiments, the insulating material 118 may further include inorganic filler or inorganic compound (e.g. silica, clay, and so on) which can be added therein to optimize coefficient of thermal expansion (CTE) of the insulating material 118. The disclosure is not limited thereto.

Figure 1F:
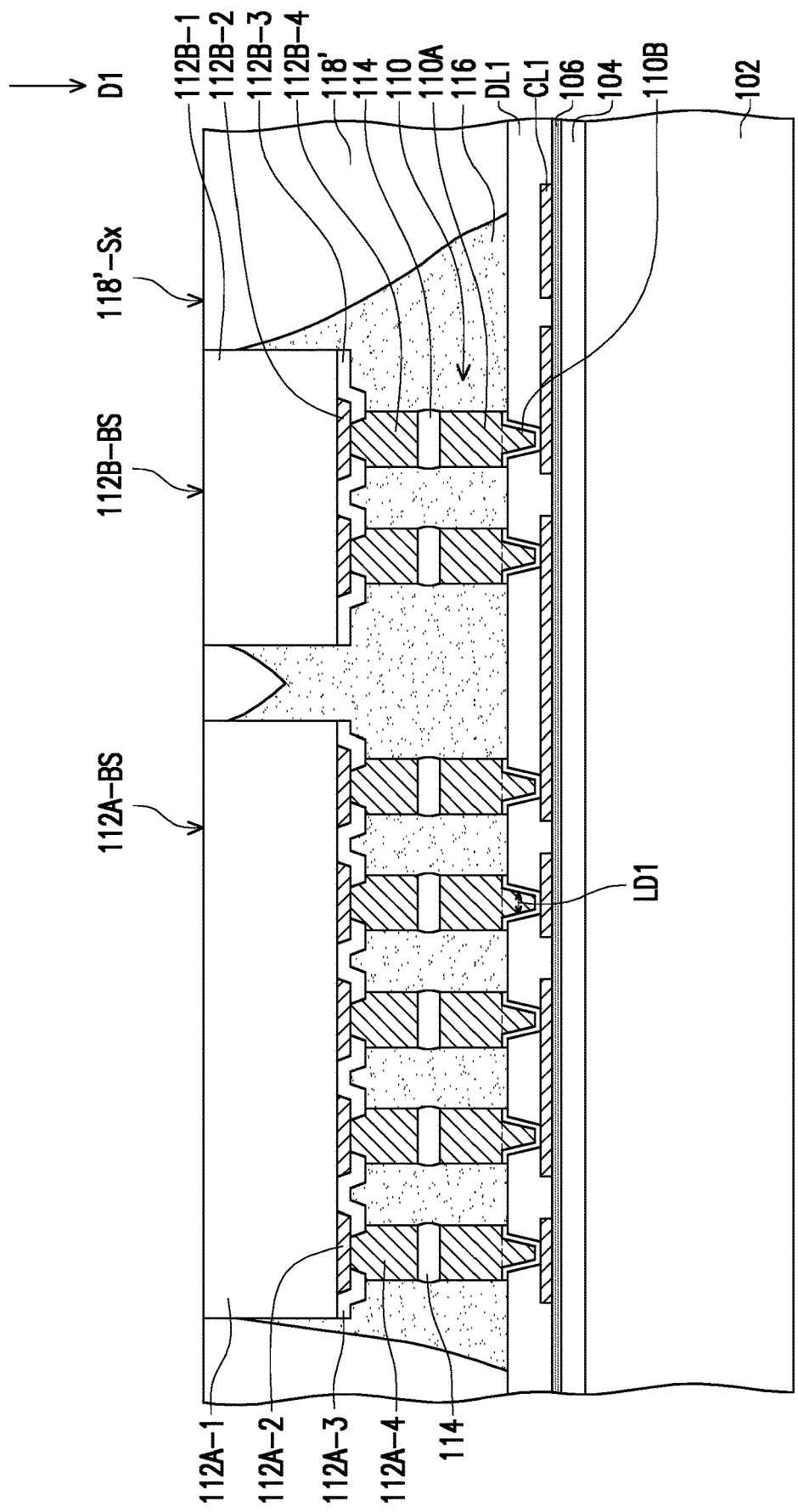

Referring to FIG. 1F, the insulating material 118 may be partially removed to expose the first semiconductor die 112A and the second semiconductor die 112B. In some embodiments, the insulating material 118 is ground or polished by a planarization step. For example, the planarization step is performed through a mechanical grinding process and/or a chemical mechanical polishing (CMP) process until a backside surface 112A-BS of the first semiconductor die 112A and a backside surface 112B-BS of the second semiconductor die 112B are revealed. In some alternative embodiment, a planarization step is not performed, and the insulating material 118 protects the backside surfaces 112A-BS and 112B-BS of the first and second semiconductor dies 112A and 112B.

In the illustrated embodiment, the insulating material 118 is polished to form an insulating encapsulant 118'. In certain embodiments, a surface 118'-Sx of the insulating encapsulant 118', the backside surface 112A-BS of the first semiconductor die 112A and the backside surface 112B-BS of the second semiconductor die 112B are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1G:
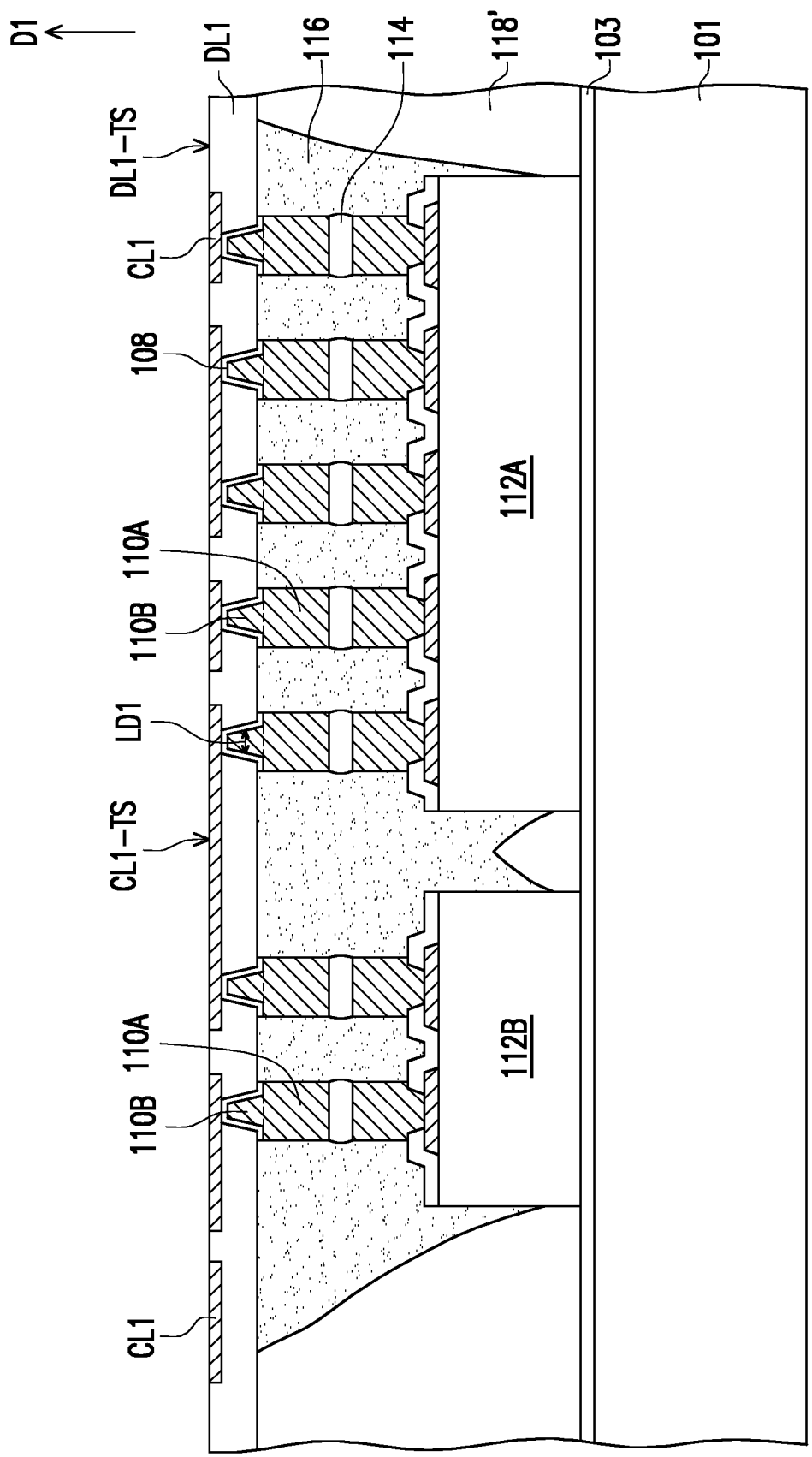

Referring to FIG. 1G, in a next step, the first carrier 102 is de-bonded, and is separated from the seed layer 106. In some embodiments, the de-bonding process includes projecting a light such as a laser light or an UV light on the debond layer 104 (e.g., the LTHC release layer) so that the first carrier 102 can be easily removed along with the debond layer 104. In some embodiments, during the de-bonding step, the structure illustrated in FIG. 1F is flipped around and transferred onto a second carrier 101 having a debond layer 103 coated thereon. In certain embodiments, after the debonding process, the first semiconductor die 112A, the second semiconductor die 112B and the insulating encapsulant 118' are disposed on the debond layer 103 and located over the second carrier 101.

In some embodiments, after transferring the components on the first carrier 102 to the second carrier 101, a planarization process may be performed to remove the seed layer 106. For example, the planarization process is performed through a mechanical grinding process and/or a chemical mechanical polishing (CMP) process until the first conductive line CL1 is revealed. In certain embodiments, the seed layer 106 (or planar seed layer) is completely removed by the planarization process. In some embodiments, after the planarization process, a top surface CL1-TS of the first conductive line CL1 is coplanar with a top surface DL1-TS of the first dielectric layer DL1, while a bottom surface of the first conductive line CL1 is joined with the via portion 110B of the connecting elements 110 (through connecting seed layer 108) and in contact with the first dielectric layer DL1.

Figure 1H:
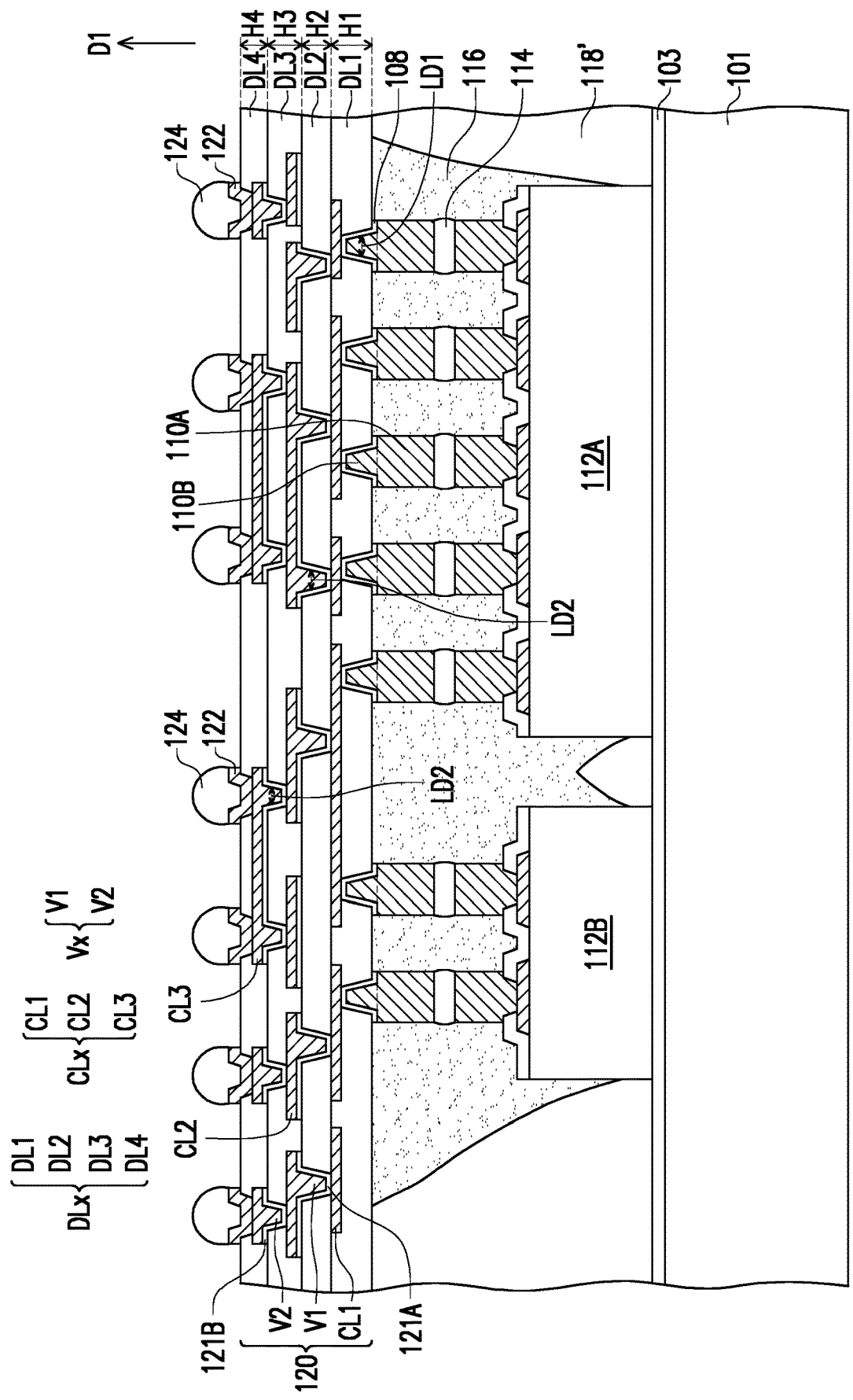

Referring to FIG. 1H, in a next step, a plurality of conductive lines (CL2, CL3), a plurality of conductive vias (V1, V2), a plurality of non-planar seed layers (121A, 121B) and a plurality of dielectric layers (DL2, DL3, DL4) are formed to be alternately stacked over the first conductive line CL1 and the first dielectric layer DL1 in the first direction D1 (or build-up direction). For example, in the illustrated embodiment, a second dielectric layer DL2 is formed over the first dielectric layer DL1, wherein the second dielectric layer DL2 is patterned to have a plurality of openings revealing a surface of the first conductive line CL1. Subsequently, a non-planar seed layer 121A is formed within the openings and over the second dielectric layer DL2, wherein the non-planar seed layer 121A contacts the first conductive line CL1. Thereafter, first conductive vias V1 and a second conductive line CL2 is formed on the non-planar seed layer 121A and being electrically connected to the first conductive line CL1 through the non-planar seed layer 121A.

In a similar way, a third dielectric layer DL3, non-planar seed layer 121B, second conductive vias V2, a third conductive line CL3 and a fourth dielectric layer DL3 are sequentially formed and stacked up in the first direction D1 (build-up direction) to constitute the redistribution layer 120. As illustrated in FIG. 1H, the via portion 110B of the connecting elements 110 is surrounded by a bottommost dielectric layer (DL1) of the dielectric layers DLx of the redistribution layer 120. In some embodiments, a lateral dimension LD1 of the via portion 110B decreases along the first direction D1 (build-up direction), whereas a lateral dimension LD2 of the conductive vias Vx increases along the first direction D1 (build-up direction). In certain embodiments, the lateral dimension LD1 and the lateral dimension LD2 refers to the width of the via portion 110B and the width of the conductive vias Vx measured in a direction that is perpendicular to the first direction D1 (build-up direction). For example, the lateral dimension D1 (or width) of the via portion 110B on a side connected to the body portion 110A is greater than the lateral dimension D1 (or width) of the via portion 110B on a side connected to the first conductive line CL1.

In the exemplary embodiment, the first dielectric layer DL1, the second dielectric layer DL2, the third dielectric layer DL3 and the fourth dielectric layer DL4 constitute the dielectric layers DLx of the redistribution layer 120. Furthermore, the first conductive line CL1, the second conductive line CL2, and the third conductive line CL3 constitute the conductive lines CLx of the redistribution layer 120. In addition, the first conductive vias V1 and the second conductive vias V2 constitute the conductive vias Vx of the redistribution layer 120. The materials for the second dielectric layer DL2, the third dielectric layer DL3 and the fourth dielectric layer DL4 are similar to the materials used for the first dielectric layer DL1. Moreover, the materials for the second conductive line CL2, the third conductive line CL3, the first conductive vias V1 and the second conductive vias V2 may be similar to the materials used for the first conductive line CL1. In the exemplary embodiment, the first dielectric layer DL1 has a first height H1, the second dielectric layer DL2 has a second height H2, the third dielectric layer DL3 has a third height H3, and the fourth dielectric layer DL4 has a fourth height H4, wherein H1>H2=H3=H4. In other words, the first dielectric layer DL1 may have a height (or thickness) that is greater than the remaining dielectric layers DLx.

In the exemplary embodiment, although only four dielectric layers DLx and three layers of conductive lines CLx are illustrated herein, but the disclosure is not limited thereto. In alternative embodiments, the number of dielectric layers DLx and layers of conductive lines CLx formed may be adjusted based on design requirement. Similarly, the number of conductive vias Vx used may be adjusted based on the number of conducive lines CLx present.

Figure 1I:
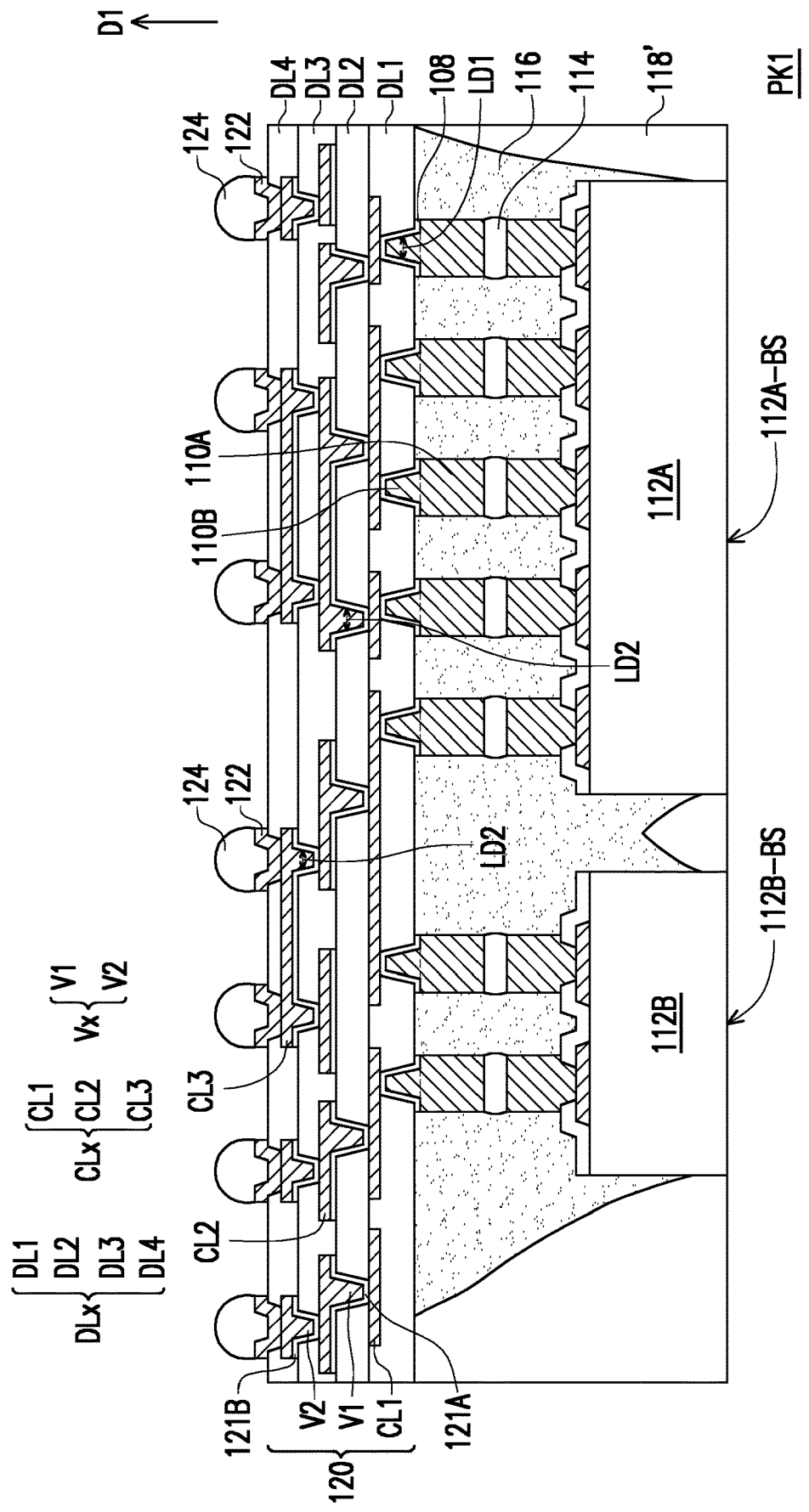

After forming the redistribution layer 120, a plurality of conductive pads 122 may be disposed on an exposed top surface of the topmost layer (third conductive line CL3) of the conductive lines CLx for electrically connecting with conductive balls. In certain embodiments, the conductive pads 122 are for example, under-ball metallurgy (UBM) patterns used for ball mount. As shown in FIG. 1I-I, the conductive pads 122 are formed on and electrically connected to the redistribution layer 120. In some embodiments, the materials of the conductive pads 122 may include copper, nickel, titanium, tungsten, or alloys thereof or the like, and may be formed by an electroplating process, for example. The number of conductive pads 122 are not limited in this disclosure, and may be selected based on the design layout. In some alternative embodiments, the conductive pads 122 may be omitted. In other words, conductive balls 124 formed in subsequent steps may be directly disposed on the redistribution layer 120.

After forming the conductive pads 122, a plurality of conductive balls 124 is disposed on the conductive pads 122 and over the redistribution layer 120. In some embodiments, the conductive balls 124 may be disposed on the conductive pads 122 by a ball placement process or reflow process. In some embodiments, the conductive balls 124 are, for example, solder balls or ball grid array (BGA) balls. In some embodiments, the conductive balls 124 are, for example, controlled collapse chip connection (C4) bumps or microbumps. The disclosure is not limited thereto. In some embodiments, the conductive balls 124 are connected to the redistribution layer 120 through the conductive pads 122. In certain embodiments, some of the conductive balls 124 may be electrically connected to the first semiconductor die 112A, while some of the conductive balls 124 may be electrically connected to the second semiconductor die 112B through the redistribution layer 120. Furthermore, in the exemplary embodiment, the number of the conductive balls 124 is not limited to the disclosure, and may be designated and selected based on the number of the conductive pads 122.

Referring to FIG. 1I, after forming the redistribution layer 120 and placing the conductive balls 124 thereon, the second carrier 101 may be debonded (in a way similar to that of the first carrier 101). In some embodiments, the debond layer 103 is further removed, and a dicing process may be performed to cut through the redistribution layer 120 and the insulating encapsulant 118' to separate the plurality of package structure PK1 from one another. Up to here, a package structure PK1 according to some exemplary embodiments of the present disclosure may be accomplished.

FIG. 2A to FIG. 2F are schematic sectional views of various stages in a method of fabricating a package structure according to some other exemplary embodiments of the present disclosure. The embodiment shown in FIG. 2A to FIG. 2F is similar to the embodiment shown in FIG. 1A to FIG. 1I, hence the same reference numerals are used to refer to the same or liked parts, and its detailed description and formation steps will be omitted or simplified herein.

Figure 2A:
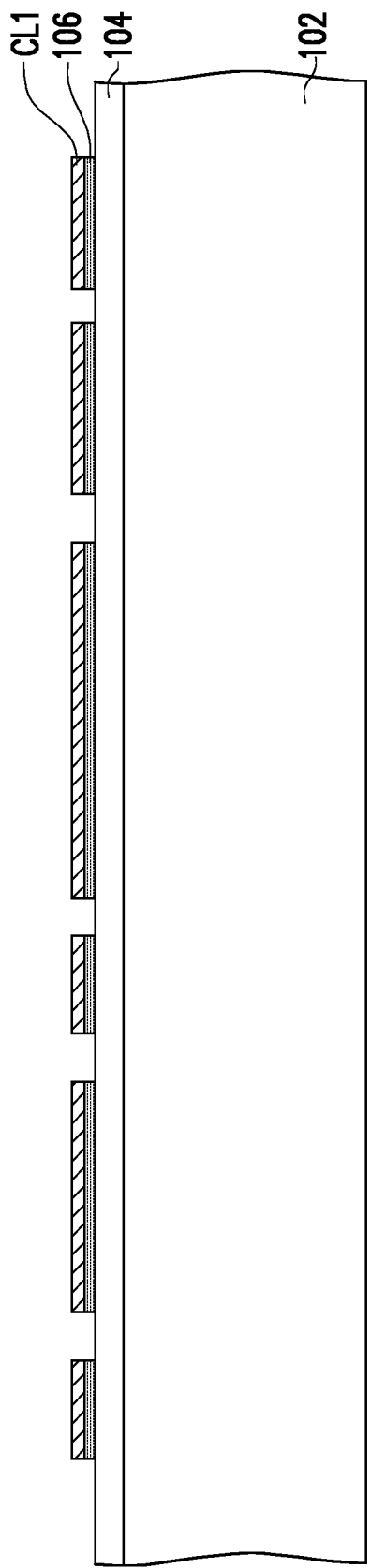
FIG. 2A to FIG. 2F are schematic sectional views of various stages in a method of fabricating a package structure according to some other exemplary embodiments of the present disclosure.
Figure 2B:
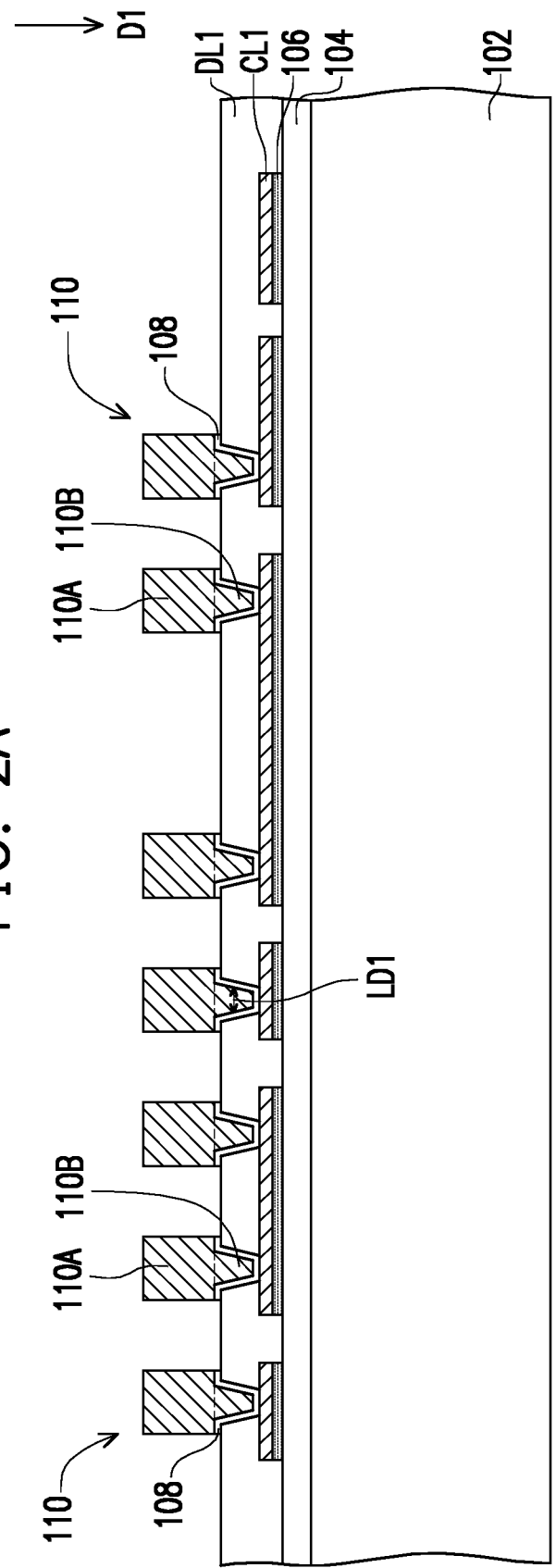

Referring to FIG. 2A, in some embodiments, after forming a first conductive line CL1 over the seed layer 106, the seed layer 106 may be etched or patterned based on the outline of the first conductive line CL1. In other words, sidewalls of the first conductive line CL1 is aligned with sidewalls of the seed layer 106. Referring to FIG. 2B, after patterning the first conductive line CL1 and the seed layer 106, a first dielectric layer DL1 may be formed to cover the first conductive line CL1 and the seed layer 106. For example, the first conductive line CL1 and the seed layer 106 are embedded in the first dielectric layer DL1. In some embodiments, a connecting seed layer 108 is formed within the openings of the first dielectric layer DL1 and electrically connected to the first conductive line CL1. Subsequently, connecting elements 110 having a body portion 110A and a via portion 110B is formed on and in physical contact with the connecting seed layer 108.

Figure 2C:
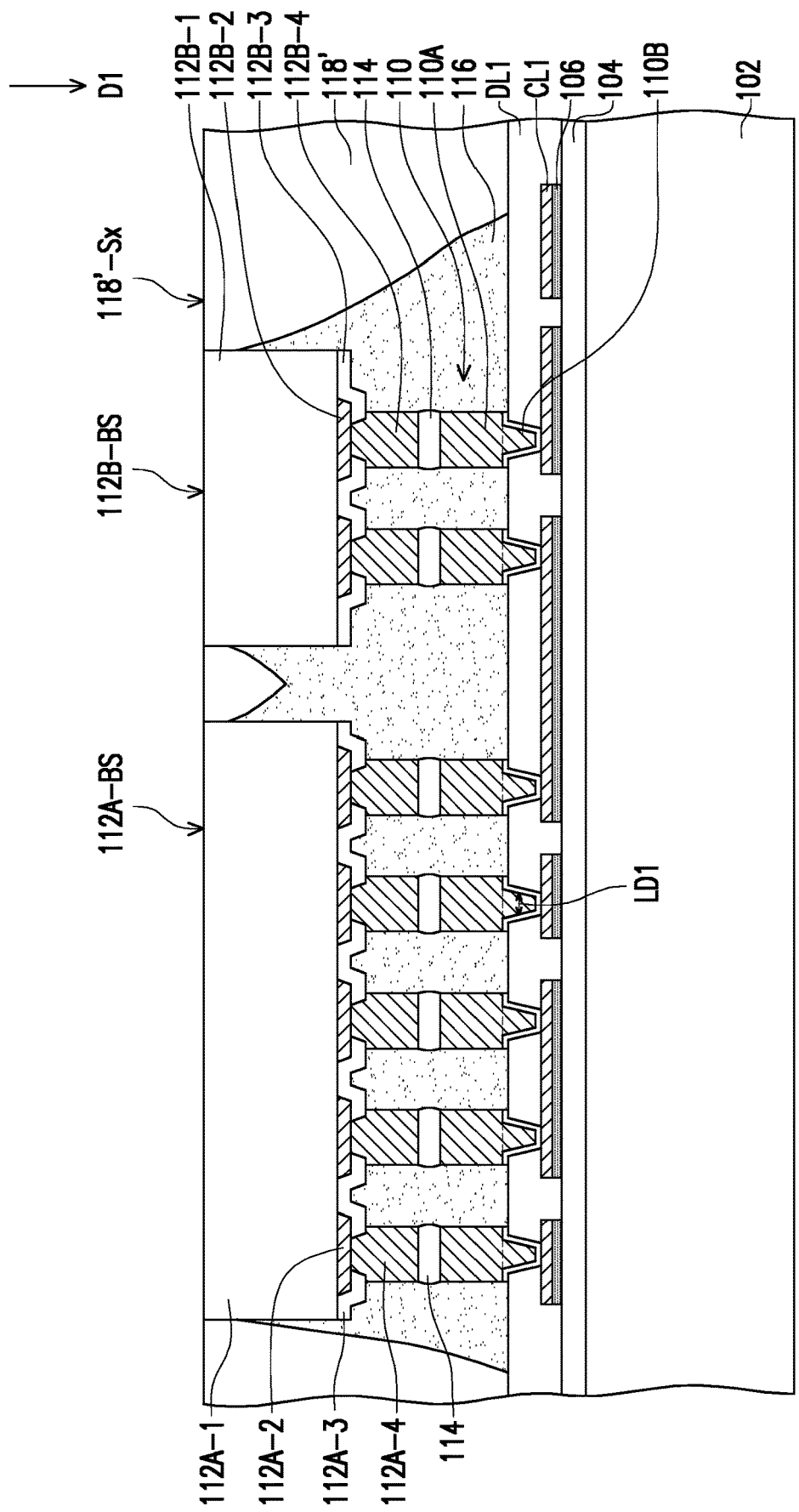

Referring to FIG. 2C, a first semiconductor die 112A and a second semiconductor die 112B are disposed on the plurality of connecting elements 110. For example, the first semiconductor die 112A and the second semiconductor die 112B are disposed on the body portion 110A of the connecting elements 110 through flip-chip bonding. The first semiconductor die 112A and the second semiconductor die 112B are similar to that described in FIG. 1D, hence its detailed description will be omitted herein. In some embodiments, after disposing the first semiconductor die 112A and the second semiconductor die 112B onto the connecting elements 110, an underfill structure 116 is formed on the first dielectric layer DL1 to cover the body portions 110A of the connecting elements 110, and to partially cover the first semiconductor die 112A and the second semiconductor die 112B. In certain embodiments, an insulating encapsulant 118' is then formed to encapsulate the first semiconductor die 112A, the second semiconductor die 112B and the underfill structure 116. In some embodiments, a surface 118'-Sx of the insulating encapsulant 118', the backside surface 112A-BS of the first semiconductor die 112A and the backside surface 112B-BS of the second semiconductor die 112B are coplanar and levelled with one another.

Figure 2D:
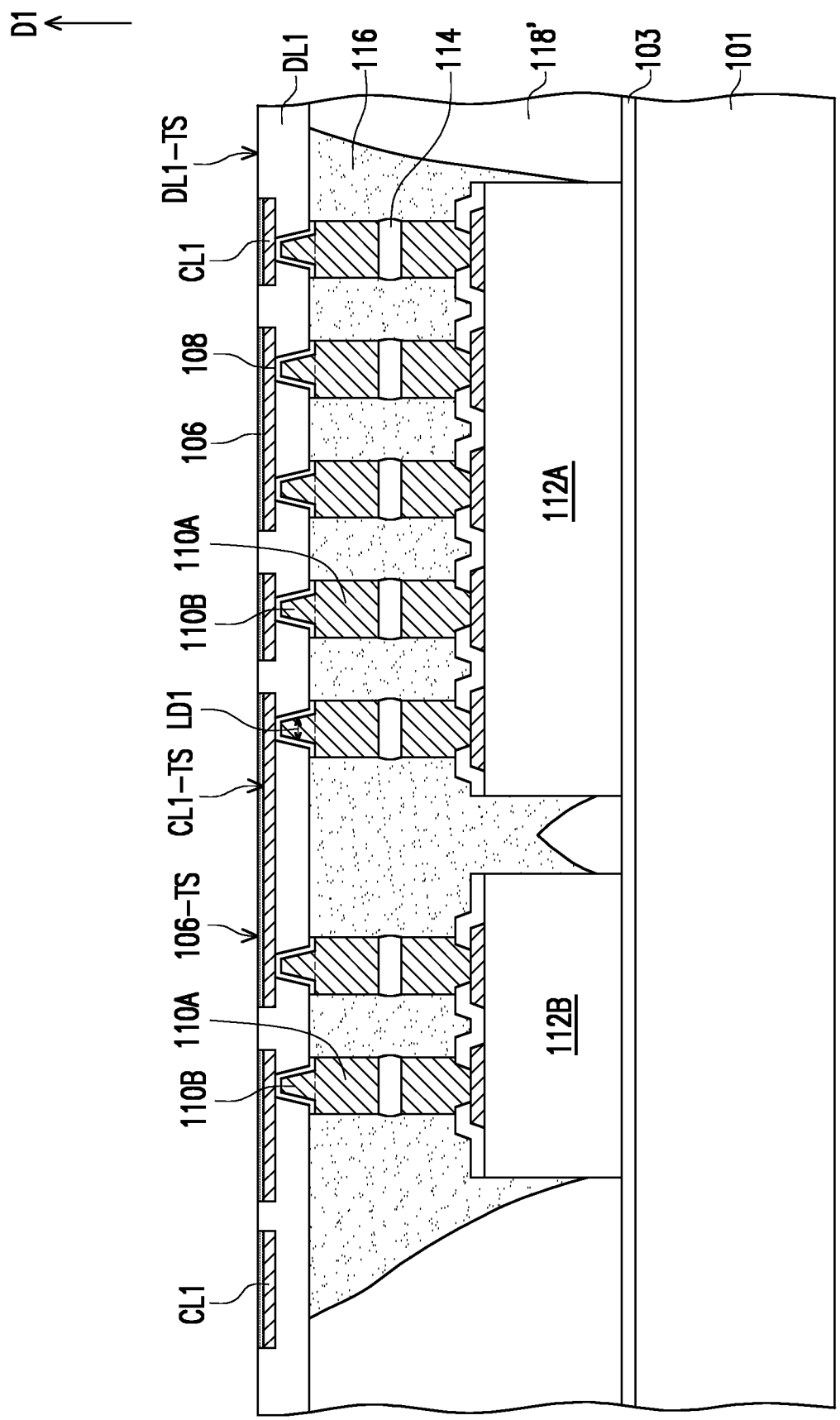

Referring to FIG. 2D, in a next step, the first carrier 102 is de-bonded, and is separated from the seed layer 106. In some embodiments, the de-bonding process includes projecting a light such as a laser light or an UV light on the debond layer 104 (e.g., the LTHC release layer) so that the first carrier 102 can be easily removed along with the debond layer 104. In some embodiments, after transferring the components on the first carrier 102 to a second carrier 101, the seed layer 106 (planar seed layer) is exposed on a top surface DL1-TS of the first dielectric layer DL1. In some embodiments, the seed layer 106 is embedded in the first dielectric layer DL1, and disposed on a top surface CL1-TS of the first conductive line CL1. In certain embodiments, the top surface 106-TS of the seed layer 106 (planar seed layer) is coplanar with the top surface DL1-TS of the first dielectric layer DL1.

Figure 2E:
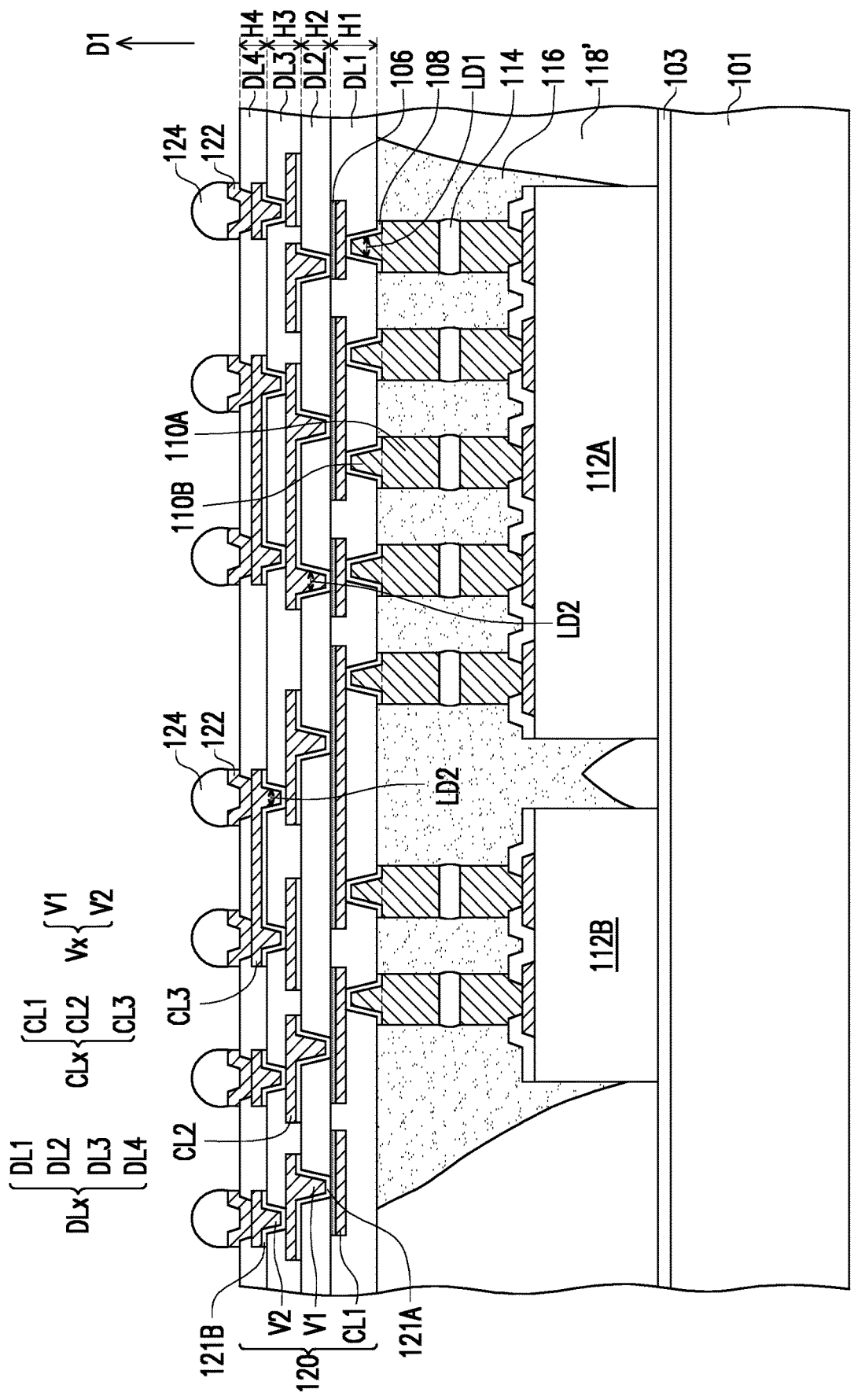

Referring to FIG. 2E, similar to the steps described in FIG. 1H for forming a redistribution layer 120, a plurality of conductive lines (CL2, CL3), a plurality of conductive vias (V1, V2), a plurality of non-planar seed layers (121A, 121B) and a plurality of dielectric layers (DL2, DL3, DL4) are formed to be alternately stacked on the seed layer 106 (planar seed layer), on the first conductive line CL1 and over the first dielectric layer DL1 in the first direction D1 (or build-up direction). In certain embodiments, the second dielectric layer DL2 is disposed on and in contact with the seed layer 106 and the first dielectric layer DL1. In some embodiments, a non-planar seed layer 121A is disposed on the second dielectric layer DL2 and being in contact with the seed layer 106 (planar seed layer) through openings of the second dielectric layer DL2. In certain embodiments, the first conductive via V1 is surrounded by the second dielectric layer DL2 and the non-planar seed layer 121A, and being electrically connected to the first conductive line CL1 through the seed layer 106. After forming the redistribution layer 120, a plurality of conductive pads 122 and a plurality of conductive balls 124 are disposed on the redistribution layer 120 and being electrically connected to the redistribution layer 120.

Figure 2F:
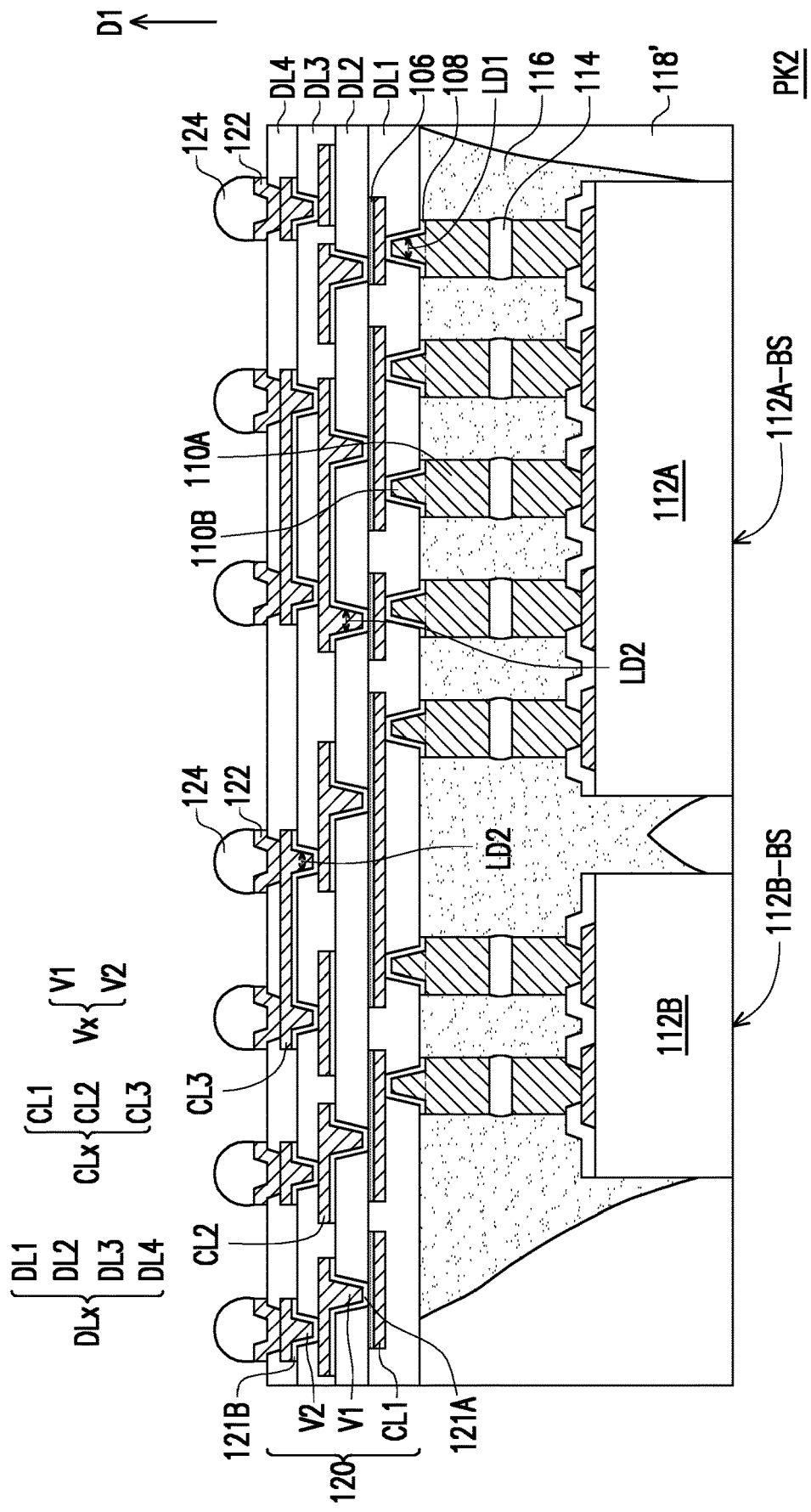

Referring to FIG. 2F, after forming the redistribution layer 120 and placing the conductive balls 124 thereon, the second carrier 101 may be debonded (in a way similar to that of the first carrier 101). In some embodiments, the debond layer 103 is further removed, and a dicing process may be performed to cut through the redistribution layer 120 and the insulating encapsulant 118' to separate the plurality of package structure PK2 from one another. Up to here, a package structure PK2 according to some exemplary embodiments of the present disclosure may be accomplished.

Figure 3:
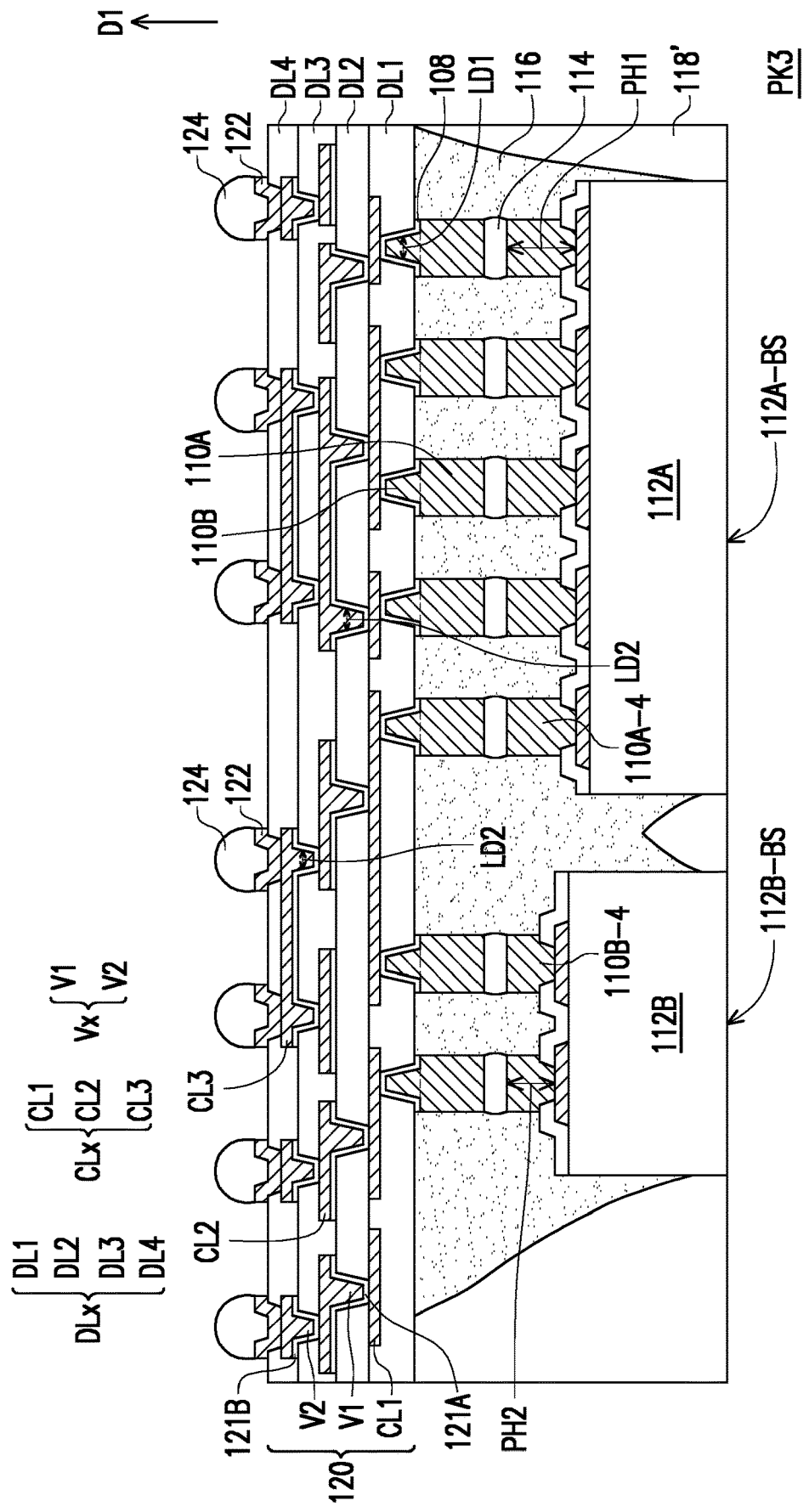
FIG. 3 is a schematic sectional view of a package structure according to some exemplary embodiments of the present disclosure.

FIG. 3 is a schematic sectional view of a package structure according to some exemplary embodiments of the present disclosure. The package structure PK3 illustrated in FIG. 3 is similar to the package structure PK1 illustrated in FIG. 1I, hence the same reference numerals are used to refer to the same or liked parts, and its detailed description will be omitted herein. The difference between the embodiments is in the design of the conductive posts of the semiconductor dies of the package structure PK3.

As illustrated in FIG. 3, a height PH1 of the first conductive posts 112A-4 of the first semiconductor die 112A is different than a height PH2 of the second conductive posts 112B-4 of the second semiconductor die 112B. For example, in some embodiments, the height PH1 of the first conductive posts 112A-4 is greater than the height PH2 of the second conductive posts 112B-4. However, a total height of the first semiconductor die 112A is substantially equal to a total height of the second semiconductor die 112B. Similar to the above embodiments, since the semiconductor dies (112A, 112B) are bonded onto the plurality of connecting elements 110 at a front side of the insulating encapsulant 118', and the grinding or planarization process is performed on backsides of the insulating encapsulant 118' and the semiconductor dies (112A, 112B), cracks in the insulating encapsulant 118' and cracks in the redistribution layer 120 may be reduced.

Figure 4:
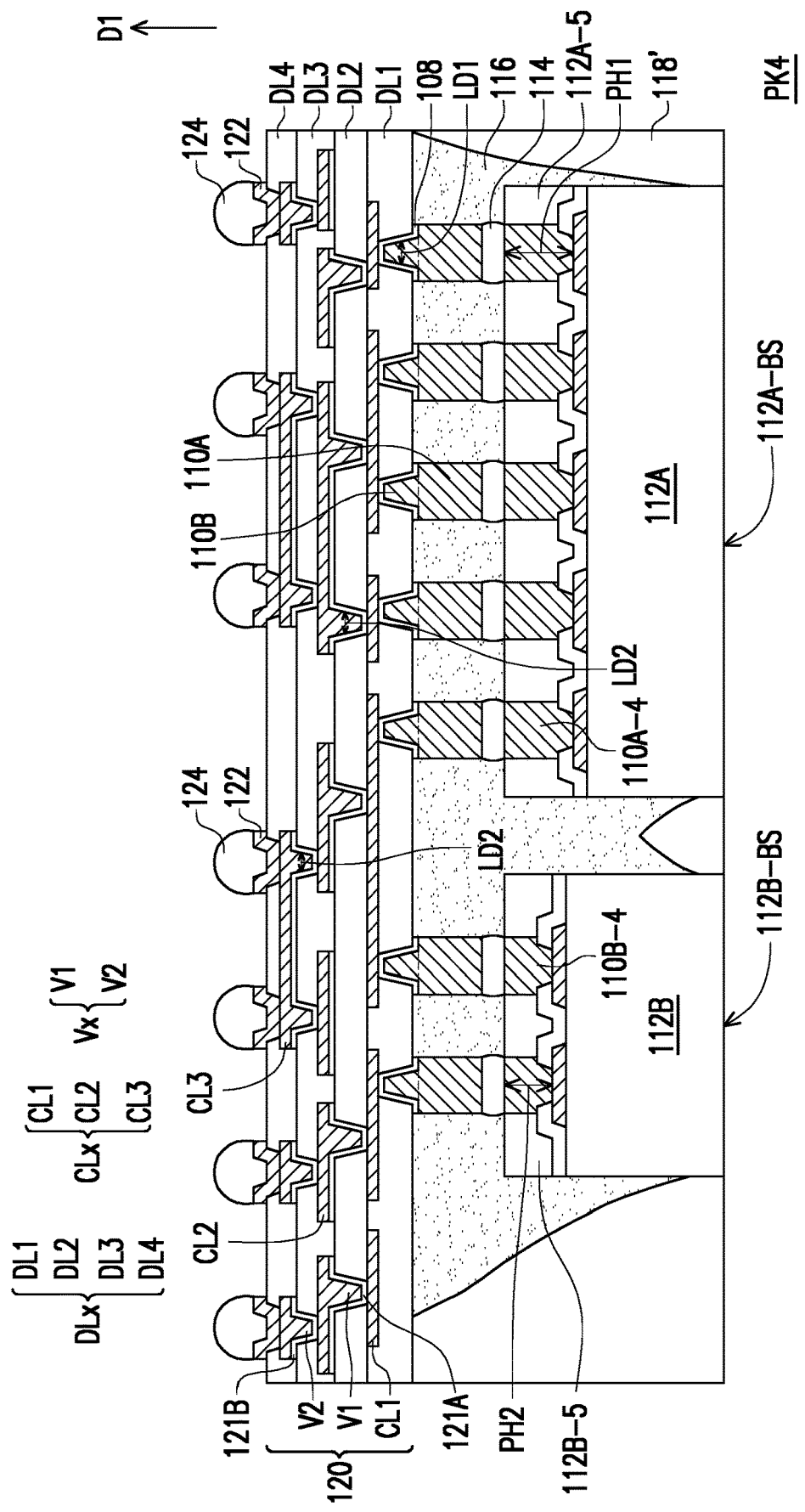
FIG. 4 is a schematic sectional view of a package structure according to some other exemplary embodiments of the present disclosure.

FIG. 4 is a schematic sectional view of a package structure according to some other exemplary embodiments of the present disclosure. The package structure PK4 illustrated in FIG. 4 is similar to the package structure PK3 illustrated in FIG. 3, hence the same reference numerals are used to refer to the same or liked parts, and its detailed description will be omitted herein. The difference between the embodiments is that a protection layer is further provided in the package structure PK4.

As illustrated in FIG. 4, the first semiconductor die 112A may include a protection layer 112A-5 that surrounds the first conductive posts 112A-4. In some embodiments, the protection layer 112A-5 is formed on the passivation layer 112A-3 or on the post passivation layer, and covering sidewalls of the first conductive posts 112A-4. In a similar way, the second semiconductor die 112B may include a protection layer 112B-5 that surrounds the second conductive posts 112B-4. In some embodiments, the protection layer 112B-5 is formed on the passivation layer 112B-3 or on the post passivation layer, and covering sidewalls of the second conductive posts 112B-4. Although both of the first semiconductor die 112A and the second semiconductor die 112B are shown in FIG. 4 to include a protection layer (112A-5 and 112B-5), however, the disclosure is not limited thereto. In alternative embodiments, only one of the first semiconductor die 112A or the second semiconductor die 112B includes the protection layer (112A-5 or 112B-5). Similar to the above embodiments, since the semiconductor dies (112A, 112B) are bonded onto the plurality of connecting elements 110 located at a front side of the insulating encapsulant 118', and the grinding or planarization process is performed on backsides of the insulating encapsulant 118' and the semiconductor dies (112A, 112B), cracks in the insulating encapsulant 118' and cracks in the redistribution layer 120 may be reduced.

Figure 5:
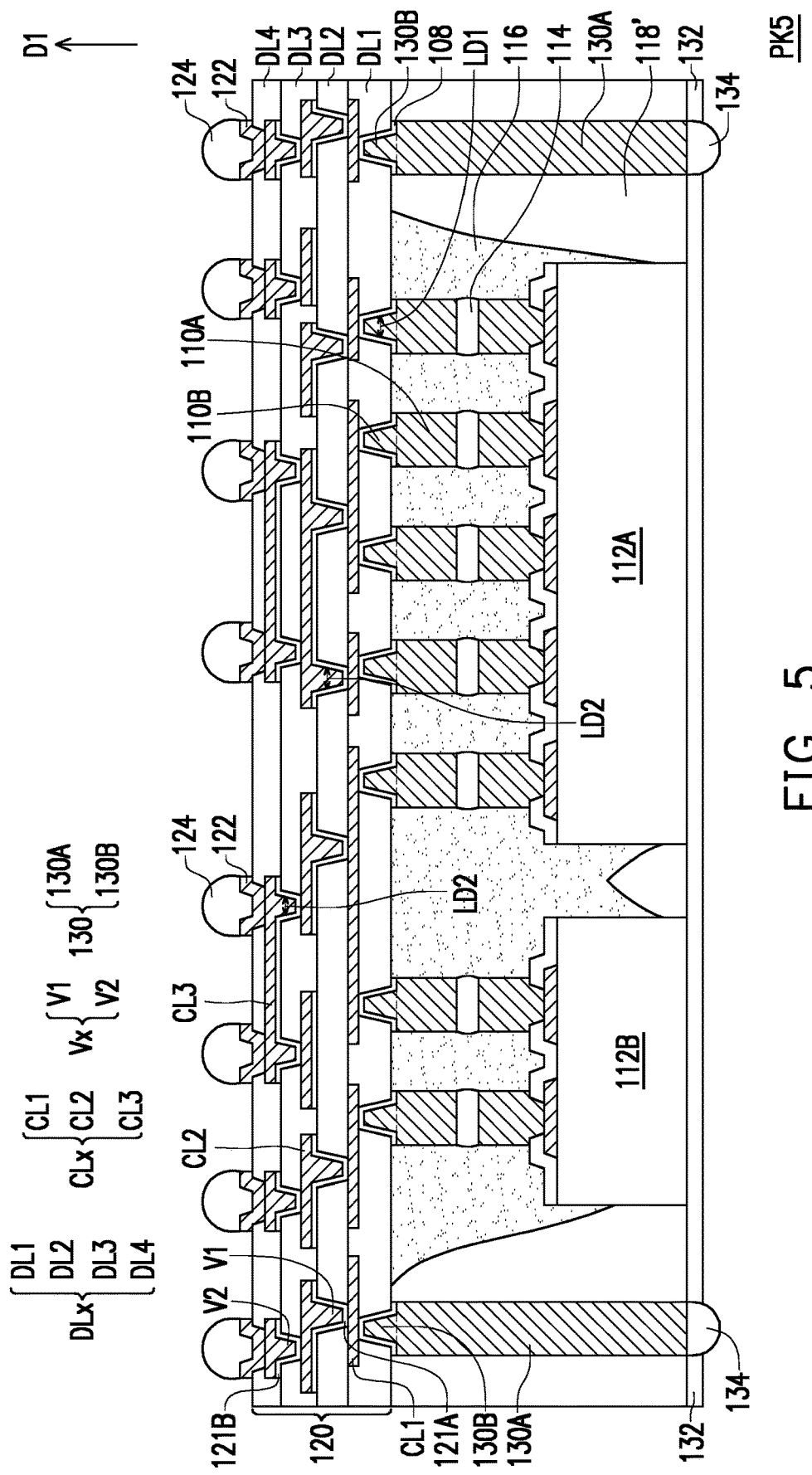
FIG. 5 is a schematic sectional view of a package structure according to some other exemplary embodiments of the present disclosure.

FIG. 5 is a schematic sectional view of a package structure according to some other exemplary embodiments of the present disclosure. The package structure PK5 illustrated in FIG. 5 is similar to the package structure PK1 illustrated in FIG. 1I, hence the same reference numerals are used to refer to the same or liked parts, and its detailed description will be omitted herein. The difference between the embodiments is in that through insulator vias are further provided in the package structure PK5.

As illustrated in FIG. 5, in some embodiments, the package structure PK5 further includes through insulator vias 130 that are surrounding the first semiconductor die 112A and the second semiconductor die 112B. In some embodiments, the through insulator vias 130 may include a body portion 130A that is surrounded by the insulating encapsulant 118', and a via portion 130B that is surrounded by the first dielectric layer DL1.

In one embodiment, the formation of the through insulator vias 130 includes forming a mask pattern (not shown) with openings, then forming a metallic material (not shown) filling up the openings by electroplating or deposition, and removing the mask pattern to form the through insulator vias 130 on the first dielectric layer DL1. In certain embodiments, the through insulator vias 130 fills into a via opening that reveals the first conductive line CL1 of the redistribution layer 120, so that the through insulator vias 130 may be electrically connected to the redistribution layer 120. In one embodiment, the material of the through insulator vias 130 may include a metal material such as copper or copper alloys, or the like. However, the disclosure is not limited thereto.

In an alternative embodiment, the through insulator vias 130 may be formed by forming a seed layer on the first dielectric layer DL1 (along with the formation of the connecting seed layer 108); forming the mask pattern with openings exposing portions of the seed layer; forming the metallic material on the exposed portions of the seed layer to form the through insulator vias 130 by plating; removing the mask pattern; and then removing portions of the seed layer exposed by the through insulator vias 408. For example, the seed layer may be a titanium/copper composited layer. For simplification, only two through insulator vias 130 are illustrated in FIG. 5. However, it should be noted that the number of through insulator vias 130 is not limited thereto, and can be selected based on requirement.

As further illustrated in FIG. 5, in some embodiments, a dielectric layer 132 is disposed on a backside surface of the insulating encapsulant 118' opposite to where the redistribution layer 120 is located. In certain embodiments, the dielectric layer 132 has openings that reveal the body portion 130A of the through insulator vias 130, whereas conductive terminals 134 are further disposed in the openings of the dielectric layer 132 and connected to the through insulator vias 130. Up to here, the package structure PK5 having dual side terminals is accomplished.

FIG. 6A to FIG. 6F are schematic sectional views of various stages in a method of fabricating a package structure according to some other exemplary embodiments of the present disclosure. The embodiment shown in FIG. 6A to FIG. 6F is similar to the embodiment shown in FIG. 1A to FIG. 1I, hence the same reference numerals are used to refer to the same or liked parts, and its detailed description will be omitted or simplified herein.

Figure 6A:
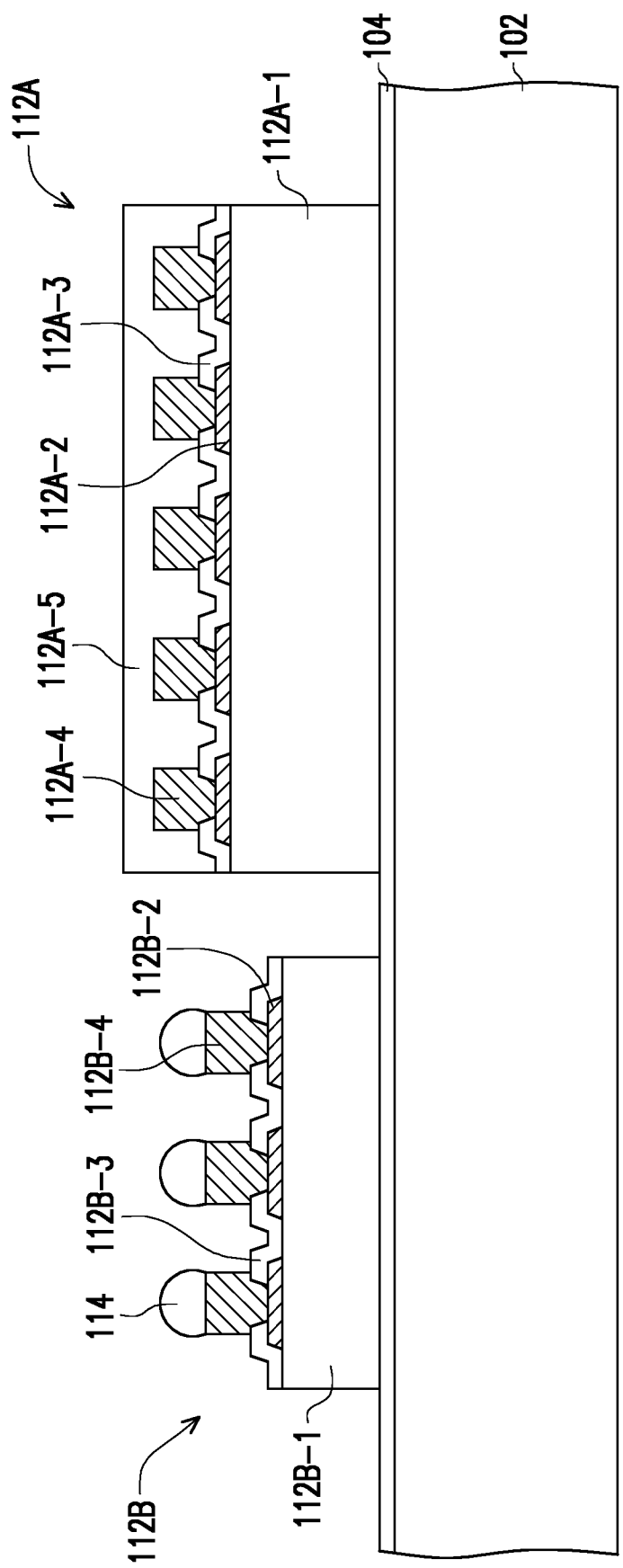
FIG. 6A to FIG. 6F are schematic sectional views of various stages in a method of fabricating a package structure according to some other exemplary embodiments of the present disclosure.

Referring to FIG. 6A, a first carrier 102 having a debond layer 104 coated thereon is provided. In some embodiments, a first semiconductor die 112A and a second semiconductor die 112B are picked and placed on the debond layer 104. In certain embodiments, the first semiconductor die 112A and the second semiconductor die 112B are attached to the debond layer 104 through a die-attach film (not shown). The first semiconductor die 112A and the second semiconductor die 112B are similar to that described in FIG. 1D. However, in the exemplary embodiment, the first semiconductor die 112A further includes a protection layer 112A-5 covering the first conductive posts 112A-4, whereas the second semiconductor die 112B is free of any protection layer, and includes conductive bumps 114 located on each of the second conductive posts 112B-4. In some embodiments, a total height of the second semiconductor die 112B is smaller than a total height of the first semiconductor die 112A.

Figure 6B:
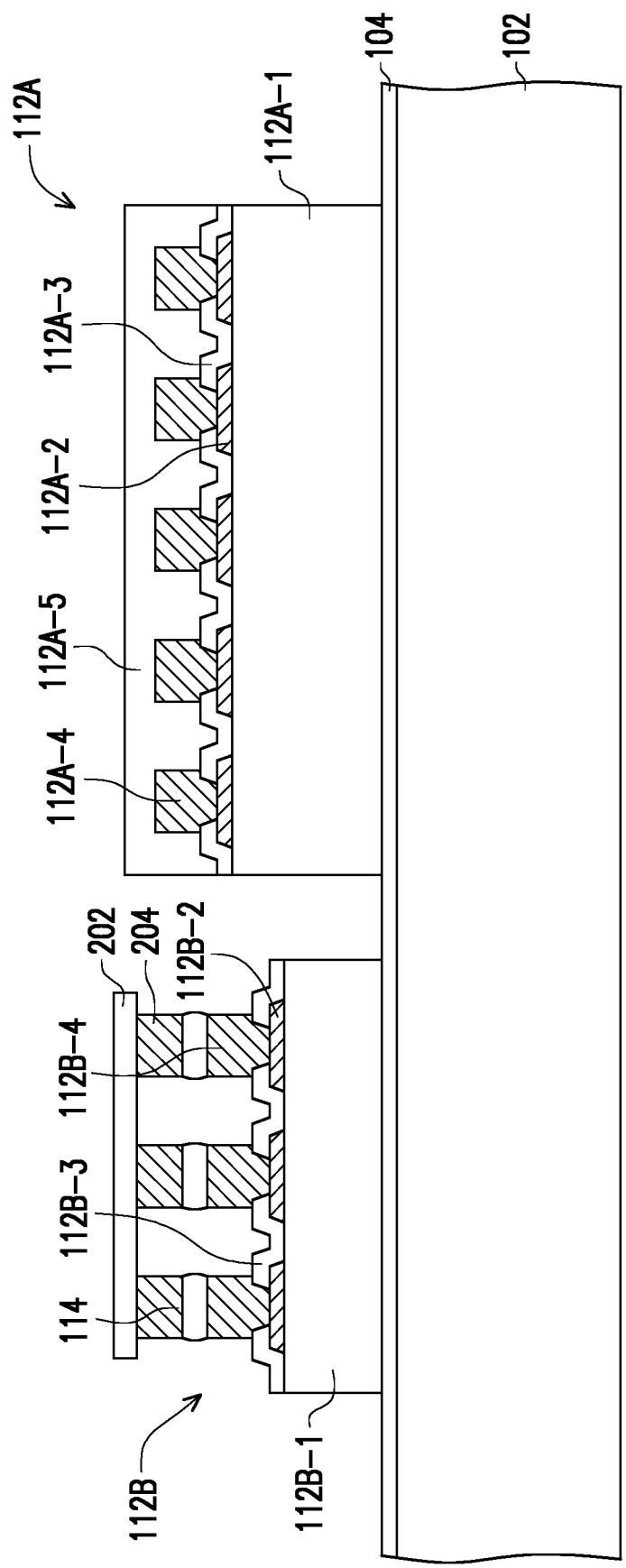

Referring to FIG. 6B, in a next step, a plurality of connecting pillars 204 located on a support structure 202 is provided. In some embodiments, the connecting pillars 204 are joined with and electrically connected to the second conductive posts 112B-4 of the second semiconductor die 112B through the conductive bumps 114. In the exemplary embodiment, a material of the connecting pillars 204 may be similar to a material of the second conductive posts 112B-4. Furthermore, the support structure 202 may be a silicon support, but the disclosure is not limited thereto. In some other embodiments, the support structure 202 may be any type of supporting structure for holding the connecting pillars 204, which may be sacrificially removed during the subsequent steps.

Figure 6C:
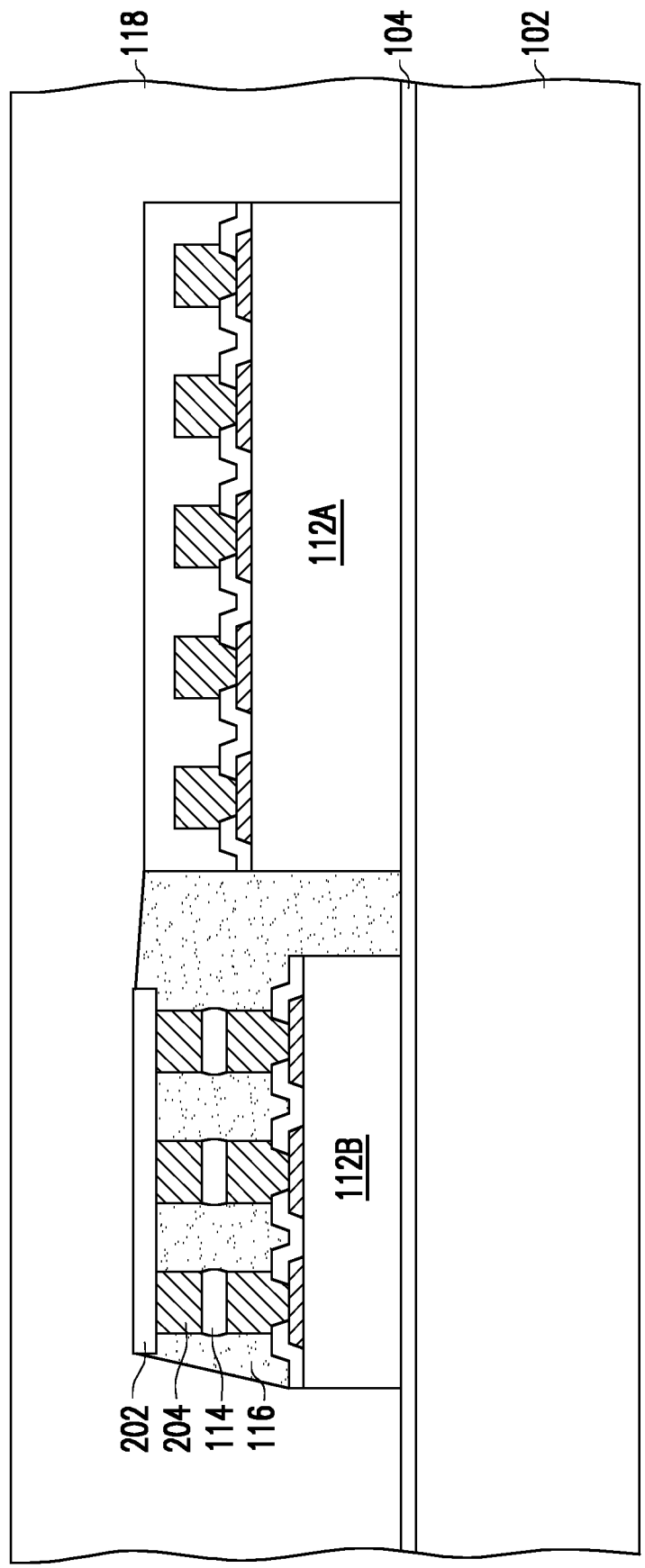

Referring to FIG. 6C, an underfill structure 116 is formed on the debond layer 104 to cover the second conductive posts 112B-4, the connecting pillars 204 and the conductive bumps 114. In some embodiments, the underfill structure 116 fill in the spaces between the first semiconductor die 112A and the second semiconductor die 112B to separate the first semiconductor die 112A from the second semiconductor die 112B. In certain embodiments, the underfill structure 116 also partially covers the support structure 202. After forming the underfill structure 116, an insulating material 118 is formed on the debond layer 104 to encapsulate the first semiconductor die 112A, the second semiconductor die 112B and to surround the plurality of connecting pillars 204.

Figure 6D:
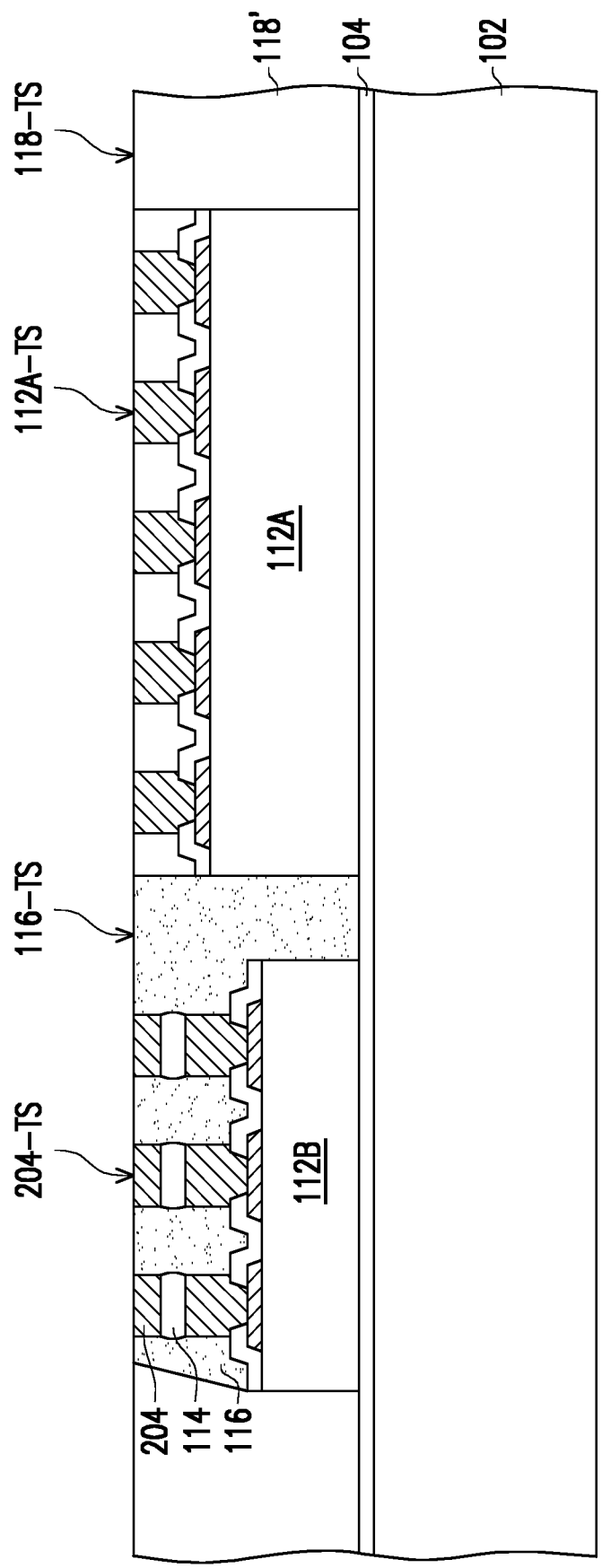

Referring to FIG. 6D, the insulating material 118 may be partially removed to expose the connecting pillars 204 and the first semiconductor die 112A. In some embodiments, the insulating material 118 is ground or polished by a planarization step. For example, the planarization step is performed through a mechanical grinding process and/or a chemical mechanical polishing (CMP) process until a top surface 204-TS of the connecting pillars 204, and a top surface 112A-TS of the first conductive posts 112A-4 are revealed. In some embodiments, the support structure 202 is completely removed during the planarization step. In some embodiments, the connecting pillars 204 and the first conductive posts 112A-4 may also be grinded/polished.

As illustrated in FIG. 6D, the insulating material 118 is polished to form an insulating encapsulant 118'. In certain embodiments, a top surface 118-TS of the insulating encapsulant 118', a top surface 116-TS of the underfill structure 116, the top surface 204-TS of the connecting pillars 204 and the top surface 112A-TS of the first conductive posts 112A-4 are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 6E:
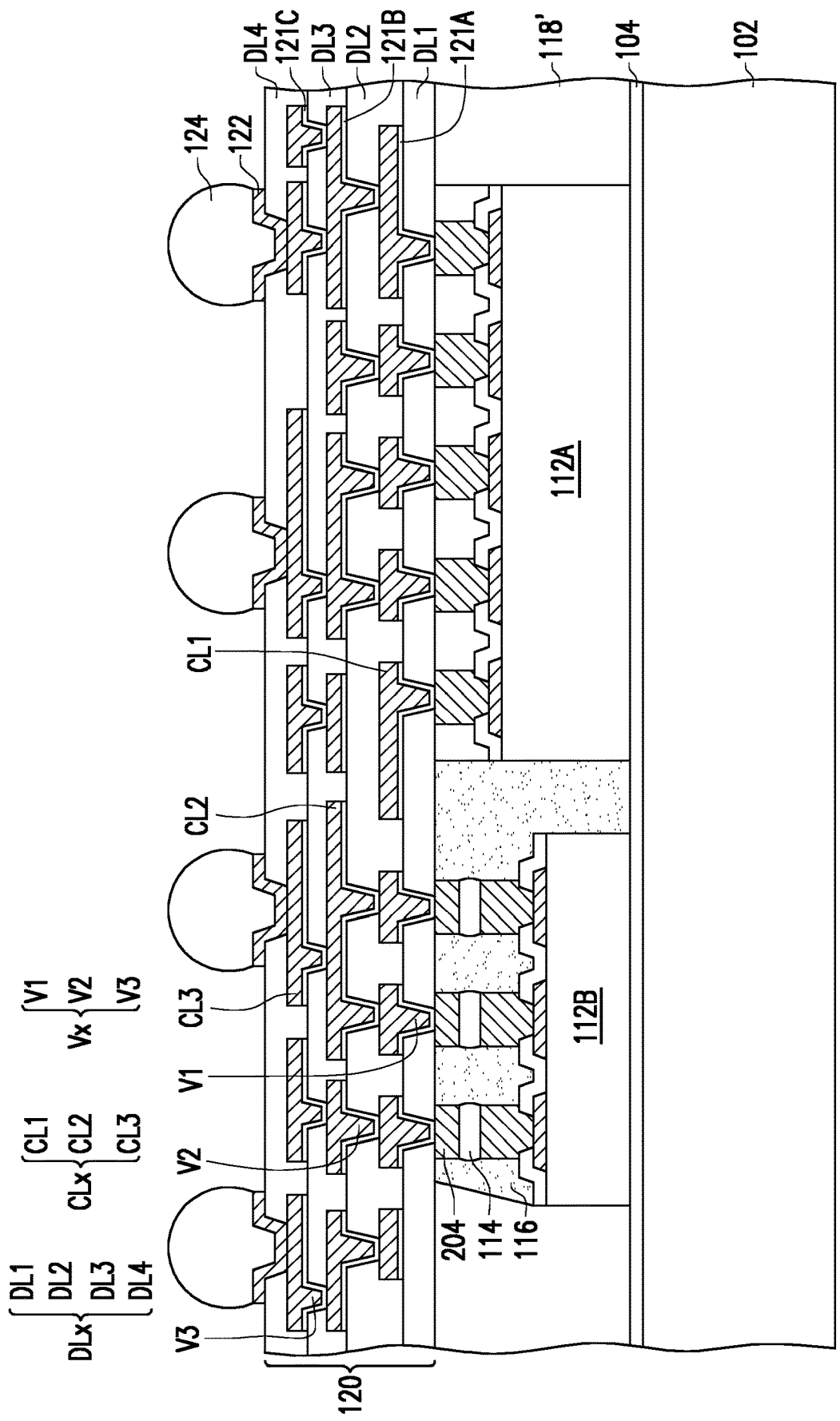

Referring to FIG. 6E, after forming the insulating encapsulant 118', a redistribution layer 120 is formed over the insulating encapsulant 118' and being electrically connected to the first semiconductor die 112A and the second semiconductor die 112B. In some embodiments, the formation of the redistribution layer 120 includes forming a plurality of conductive lines CLx (including CL1, CL2 and CL3), a plurality of conductive vias Vx (including V1, V2 and V3), a plurality of non-planar seed layers (including 121A, 121B and 121C) and a plurality of dielectric layers DLx (including DL1, DL2, DL3 and DL4) alternately stacked over the insulating encapsulant 118'. In some embodiments, the first conductive vias V1 is electrically connected to the connecting pillars 204 and the first conductive posts 112A-4 through the non-planar seed layer 121A.

After forming the redistribution layer 120, a plurality of conductive pads 122 may be disposed on an exposed top surface of the topmost layer (third conductive line CL3) of the conductive lines CLx for electrically connecting with conductive balls. In certain embodiments, the conductive pads 122 are for example, under-ball metallurgy (UBM) patterns used for ball mount. As shown in FIG. 6E, the conductive pads 122 are formed on and electrically connected to the redistribution layer 120. The number of conductive pads 122 are not limited in this disclosure, and may be selected based on the design layout. Thereafter, a plurality of conductive balls 124 is disposed on the conductive pads 122 and over the redistribution layer 120. In some embodiments, the conductive balls 124 may be disposed on the conductive pads 122 by a ball placement process or reflow process. In some embodiments, the conductive balls 124 are, for example, solder balls or ball grid array (BGA) balls. In some embodiments, the conductive balls 124 are, for example, controlled collapse chip connection (C4) bumps or micro-bumps. The disclosure is not limited thereto.

Figure 6F:
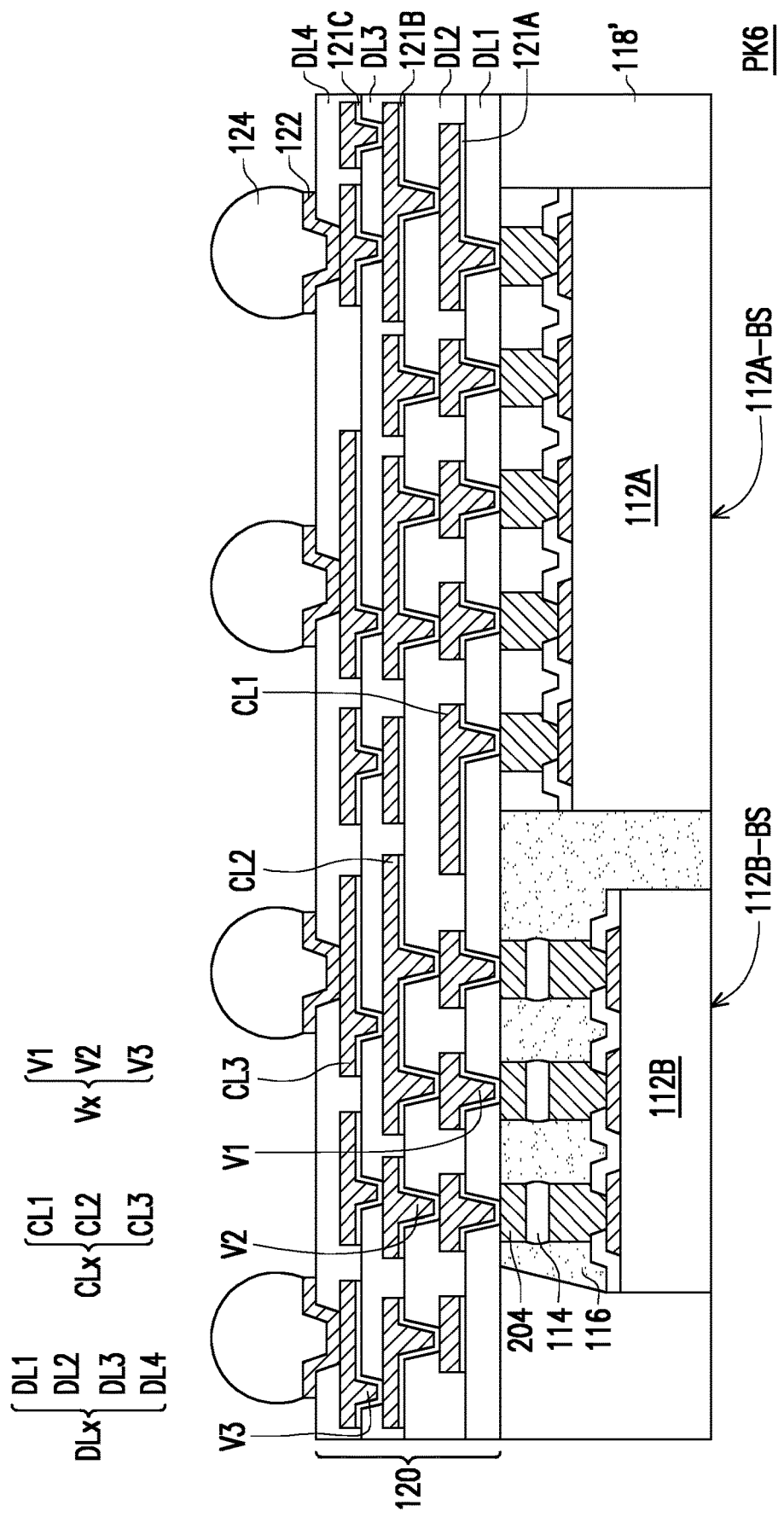

Referring to FIG. 6F, after forming the redistribution layer 120 and placing the conductive balls 124 thereon, the first carrier 102 may be de-bonded. In some embodiments, the debond layer 104 is further removed, and a dicing process may be performed to cut through the redistribution layer 120 and the insulating encapsulant 118' to separate the plurality of package structure PK6 from one another. Up to here, a package structure PK6 according to some other exemplary embodiments of the present disclosure may be accomplished.

FIG. 7A to FIG. 7H are schematic sectional views of various stages in a method of fabricating a package structure according to some other exemplary embodiments of the present disclosure. The embodiment shown in FIG. 7A to FIG. 7H is similar to the embodiment shown in FIG. 6A to FIG. 6F, hence the same reference numerals are used to refer to the same or liked parts, and its detailed description will be omitted or simplified herein.

Figure 7A:
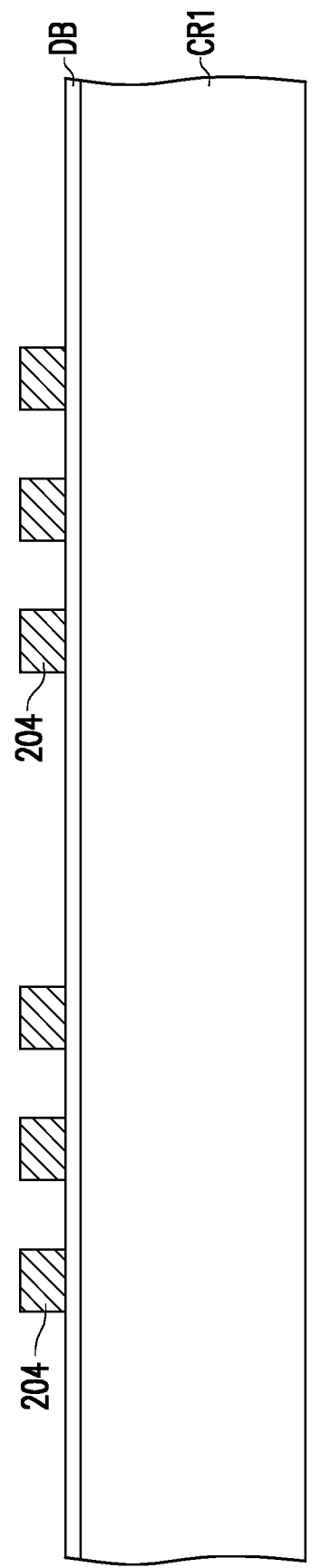
FIG. 7A to FIG. 7H are schematic sectional views of various stages in a method of fabricating a package structure according to some other exemplary embodiments of the present disclosure.

The steps of providing semiconductor dies having connecting pillars 204 located thereon are described with reference to FIG. 7A to FIG. 7C. Referring to FIG. 7A, in some embodiments, a carrier CR1 having a debond layer DB coated thereon is provided. The carrier CR1 and the debond layer DB may be similar to the first carrier 102 and the debond layer 104 described in the above embodiments. In some embodiments, a plurality of connecting pillars 204 are formed on the debond layer DB and over the carrier CR1.

Figure 7B:
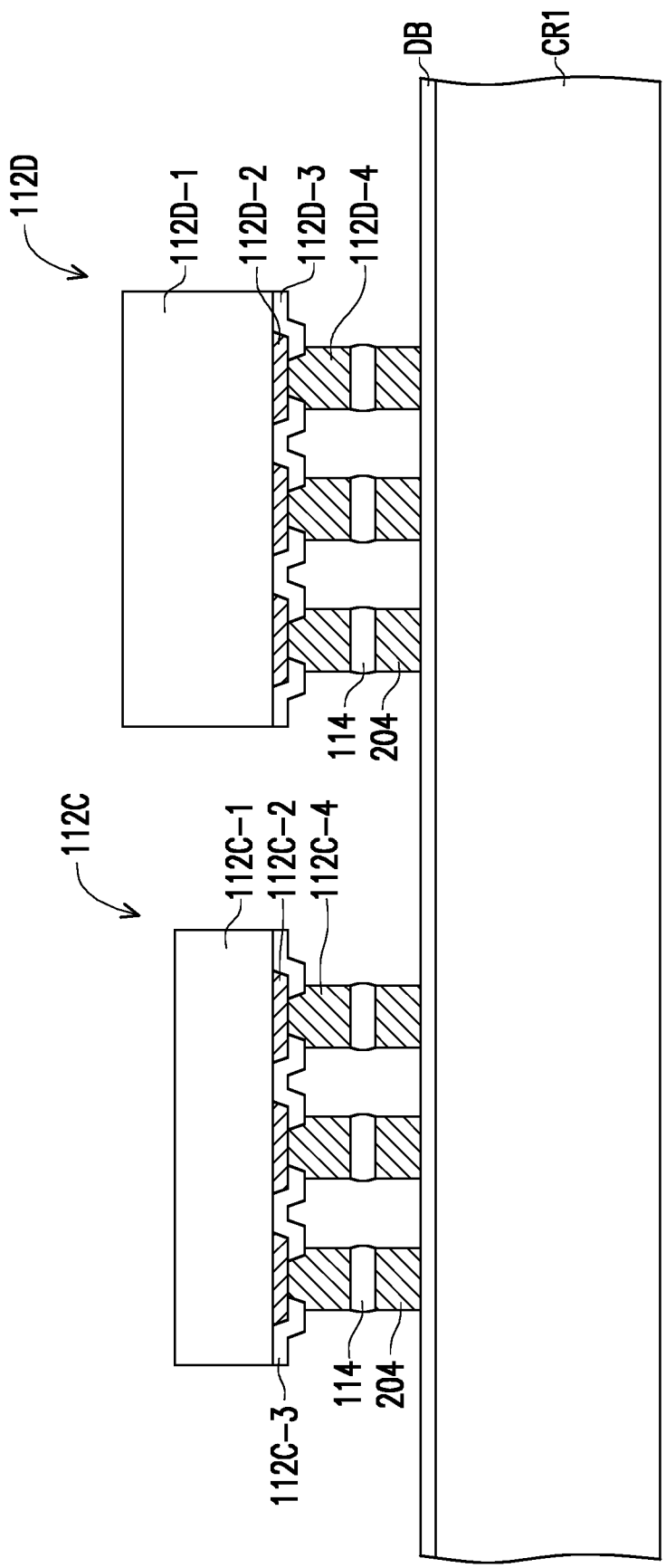

Referring to FIG. 7B, after forming the connecting pillars 204, semiconductor dies 112C and 112D are disposed on the connecting pillars 204 through flip-chip bonding. The semiconductor dies 112C and 112D are similar to the first semiconductor die 112A or the second semiconductor die 112B described in the above embodiments, and its detailed description will be omitted herein. Briefly, each of the semiconductor dies 112C and 112D includes a semiconductor substrate (112C-1/112D-1), a plurality of conductive pads (112C-2/112D-2), a passivation layer (112C-3/112D-3) and a plurality of conductive posts (112C-4/112D-4). In some embodiments, the conductive posts (112C-4/112D-4) of the semiconductor dies 112C and 112D are bonded to the connecting pillars 204 through the conductive bumps 114.

Figure 7C:
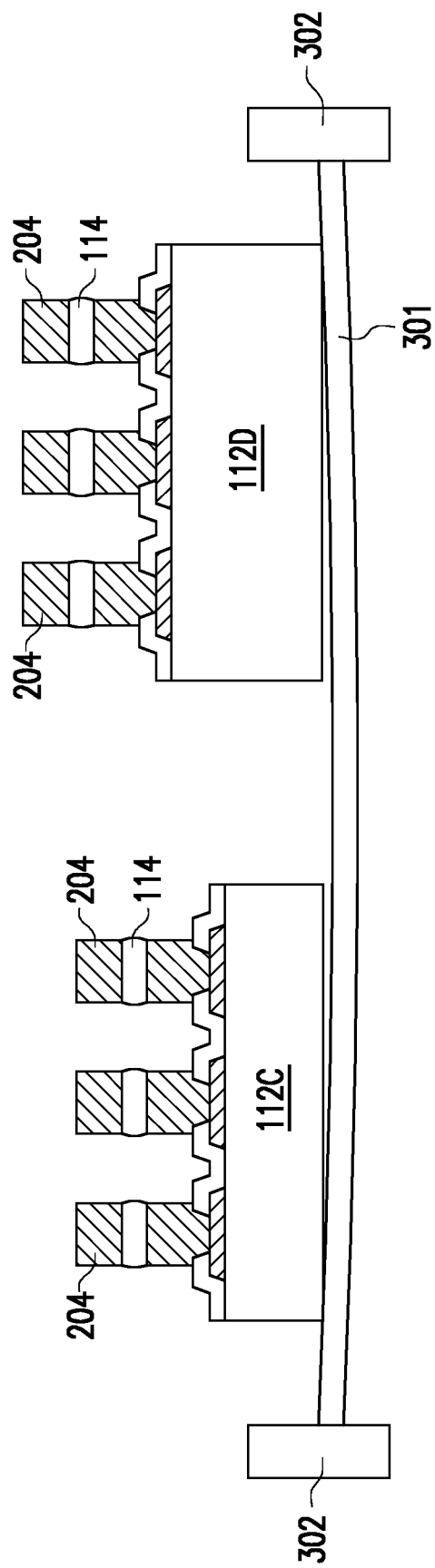

Referring to FIG. 7C, the structure illustrated in FIG. 1B is turned upside down and attached to a tape 301 (e.g., a dicing tape) supported by a frame 302. As illustrated in FIG. 7C, the carrier CR1 is debonded and is separated from the semiconductor dies 112C and 112D. In some embodiments, the de-bonding process includes projecting a light such as a laser light or an UV light on the debond layer DB (e.g., a LTHC release layer) so that the carrier CR1 can be easily removed along with the debond layer DB. During the de-bonding step, the tape 301 is used to secure the semiconductor dies 112C and 112D before de-bonding the carrier CR1 and the debond layer DB. After the de-bonding process, semiconductor dies 112C and 112D having connecting pillars 204 located thereon are fabricated.

Figure 7D:
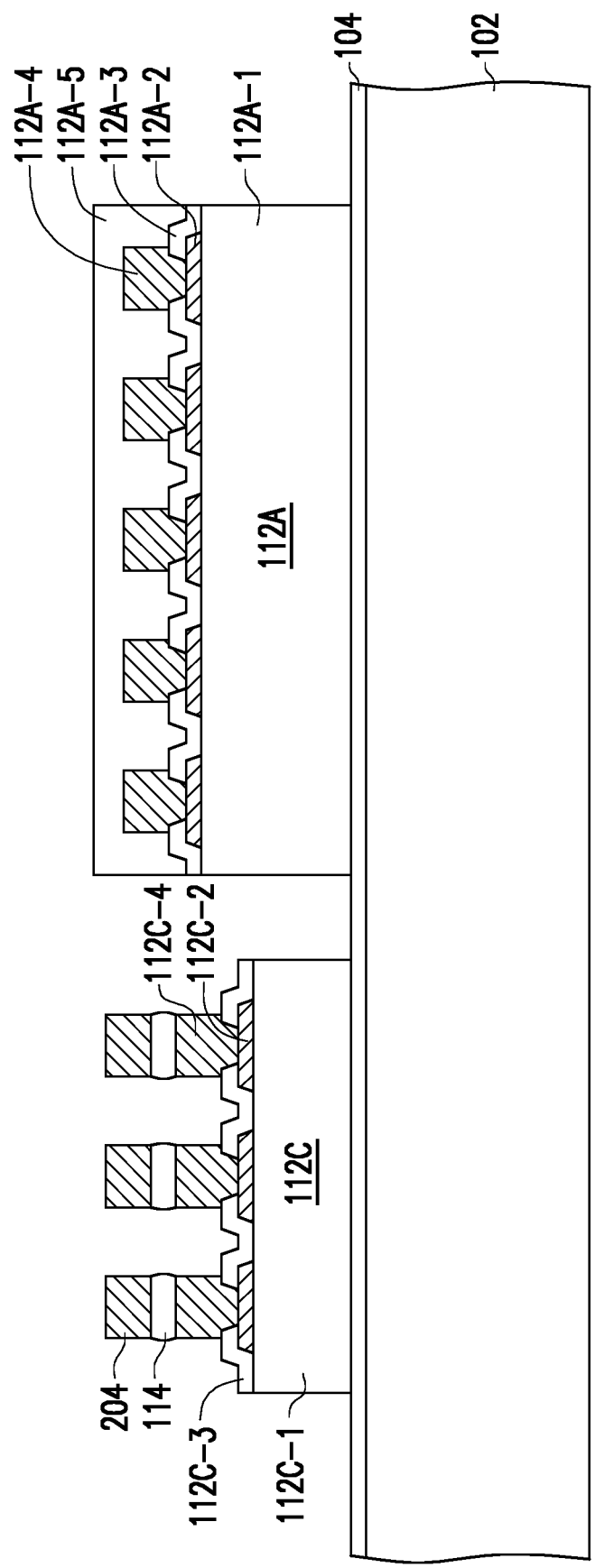
Figure 7E:
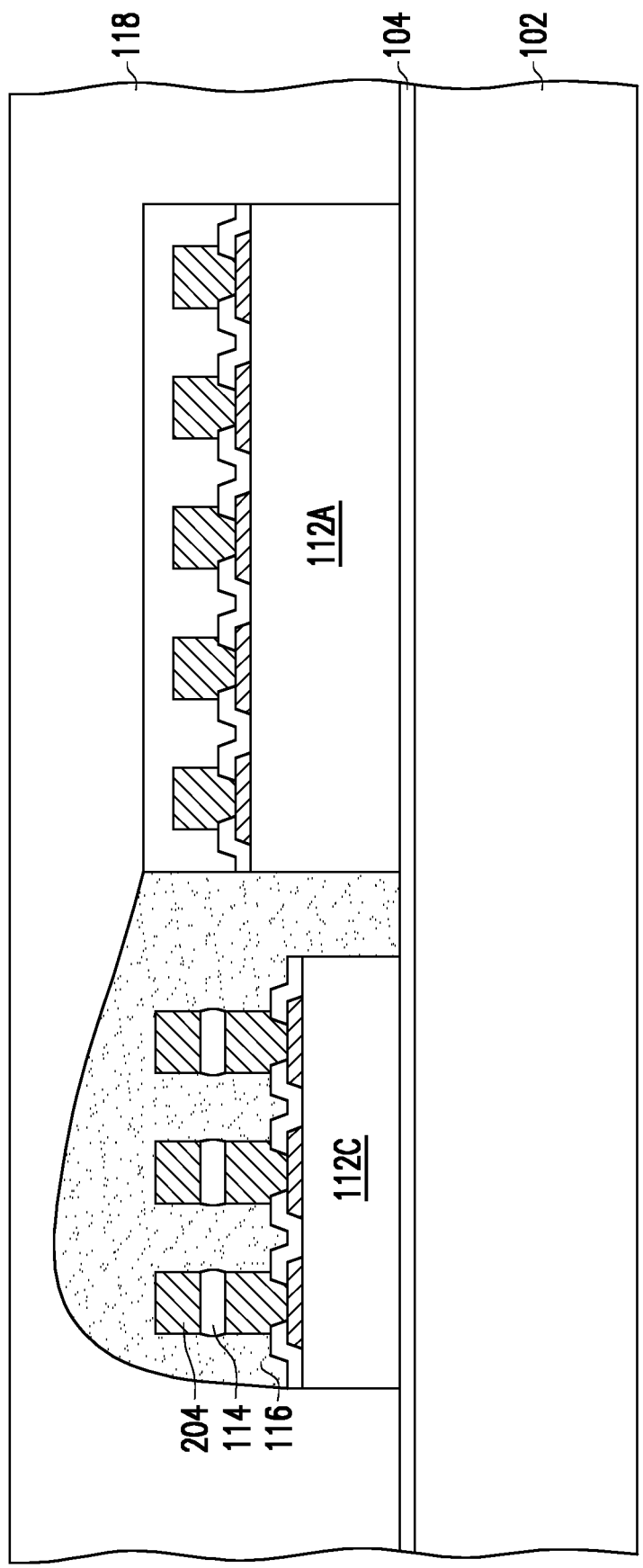

Referring to FIG. 7D, a first semiconductor die 112A and a semiconductor die 112C fabricated in FIG. 7C are disposed on the debond layer 104 and over the carrier 102. In the exemplary embodiment, the first semiconductor die 112A further includes a protection layer 112A-5 covering the first conductive posts 112A-4, whereas the semiconductor die 112C further includes conductive bumps 114 and connecting pillars 204 located thereon. Referring to FIG. 7E, in a subsequent step, an underfill structure 116 is formed on the debond layer 104 to cover the conductive posts 112C-4, the connecting pillars 204 and the conductive bumps 114. In some embodiments, the underfill structure 116 fill in the spaces between the first semiconductor die 112A and the semiconductor die 112C to separate the first semiconductor die 112A from the semiconductor die 112C. After forming the underfill structure 116, an insulating material 118 is formed on the debond layer 104 to encapsulate the first semiconductor die 112A, the semiconductor die 112C and to surround the plurality of connecting pillars 204.

Figure 7F:
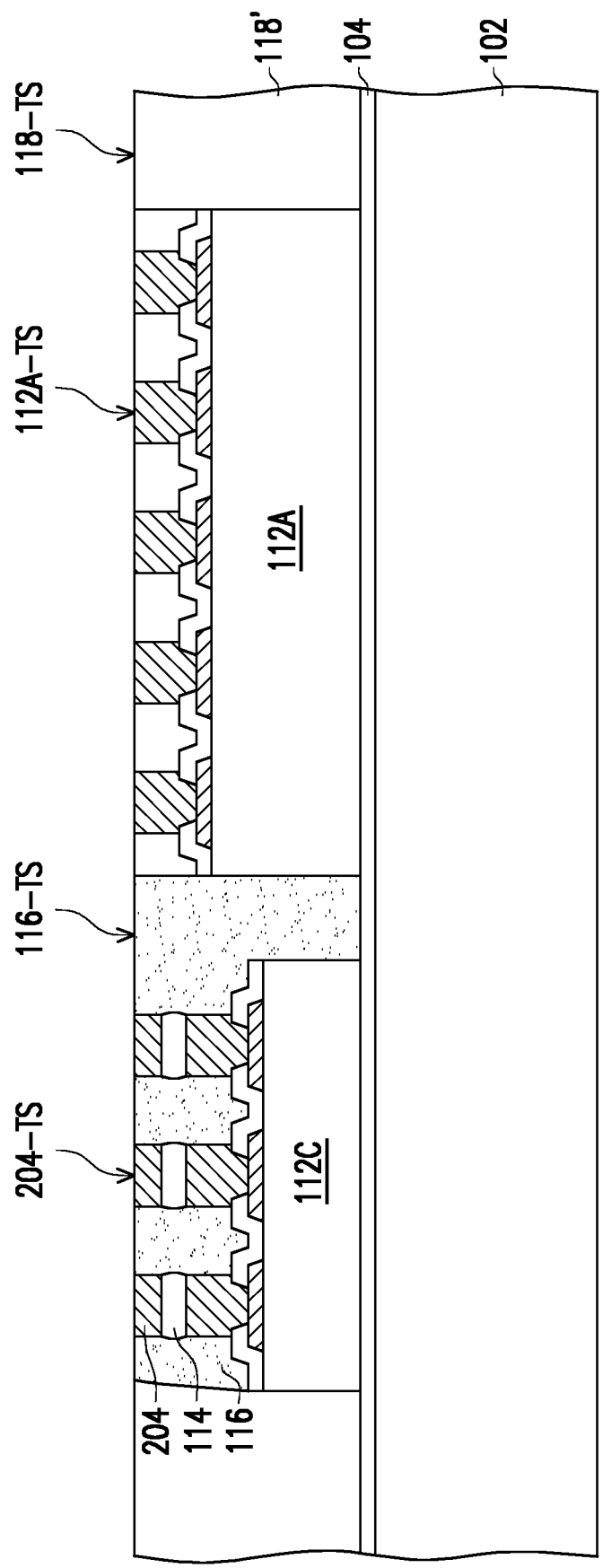

Referring to FIG. 7F, the insulating material 118 may be partially removed to expose the connecting pillars 204 and the first semiconductor die 112A. In some embodiments, the insulating material 118 is ground or polished by a planarization step. For example, the planarization step is performed through a mechanical grinding process and/or a chemical mechanical polishing (CMP) process until a top surface 204-TS of the connecting pillars 204, and a top surface 112A-TS of the first conductive posts 112A-4 are revealed. In some embodiments, the insulating material 118 is polished to form an insulating encapsulant 118'. In certain embodiments, a top surface 118-TS of the insulating encapsulant 118', a top surface 116-TS of the underfill structure 116, the top surface 204-TS of the connecting pillars 204 and the top surface 112A-TS of the first conductive posts 112A-4 are coplanar and levelled with one another.

Figure 7G:
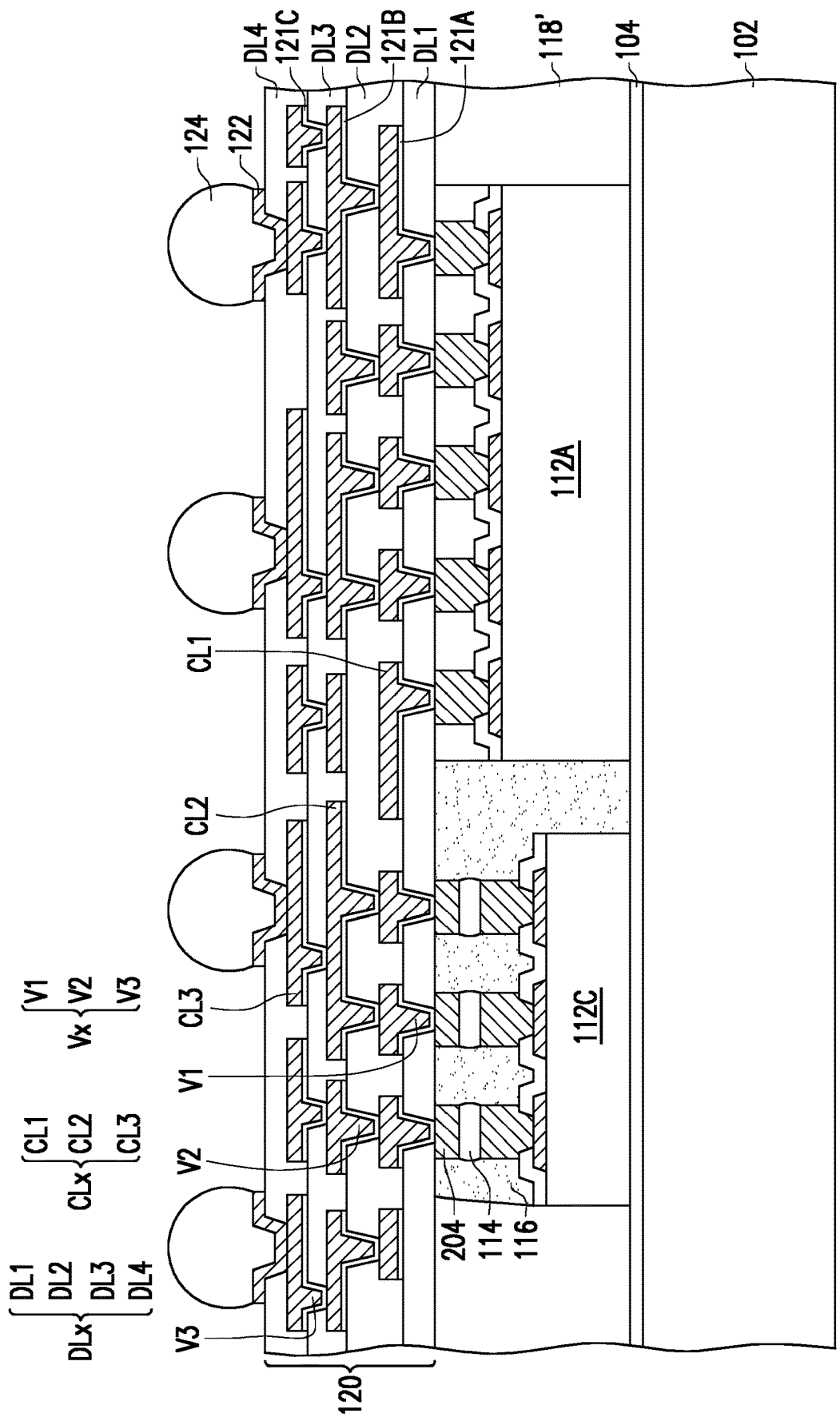

Referring to FIG. 7G, after forming the insulating encapsulant 118', a redistribution layer 120 is formed over the insulating encapsulant 118' in the same way as described in FIG. 6E. In some embodiments, the redistribution layer 120 is electrically connected to the first semiconductor die 112A and the semiconductor die 112C. In certain embodiments, the redistribution layer 120 is electrically connected to the semiconductor die 112C through the connecting pillars 204. After forming the redistribution layer 120, a plurality of conductive pads 122 may be disposed on the redistribution layer 120 and being electrically connected thereto. Thereafter, a plurality of conductive balls 124 is disposed on the conductive pads 122 and over the redistribution layer 120. In some embodiments, the conductive balls 124 may be disposed on the conductive pads 122 by a ball placement process or reflow process. In certain embodiments, the conductive balls 124 is electrically connected to the first semiconductor die 112A and/or the semiconductor die 112C.

Figure 7H:
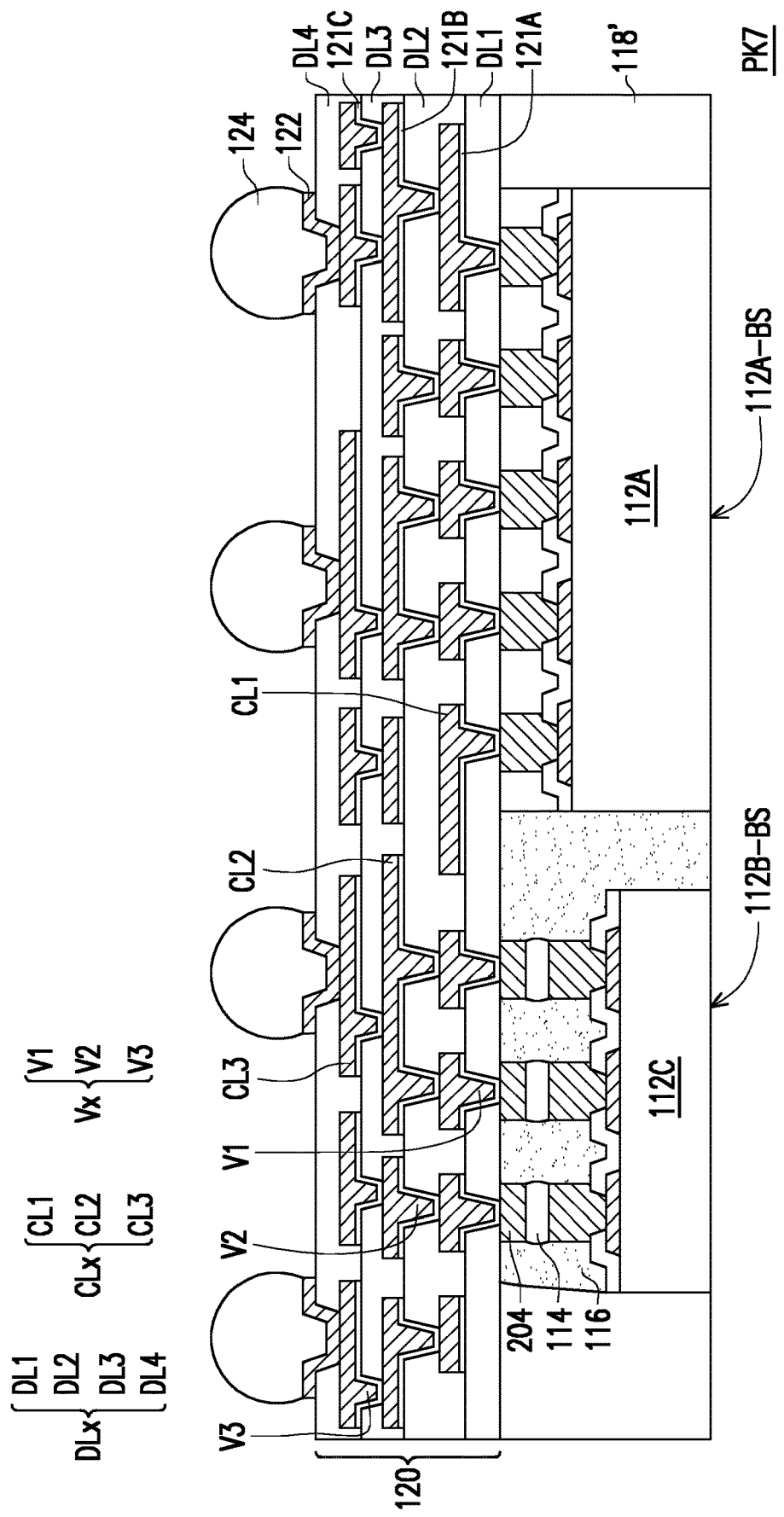

Referring to FIG. 7H, after forming the redistribution layer 120 and placing the conductive balls 124 thereon, the first carrier 102 may be de-bonded. In some embodiments, the debond layer 104 is further removed, and a dicing process may be performed to cut through the redistribution layer 120 and the insulating encapsulant 118' to separate the plurality of package structure PK7 from one another. Up to here, a package structure PK7 according to some other exemplary embodiments of the present disclosure may be accomplished.

Figure 8:
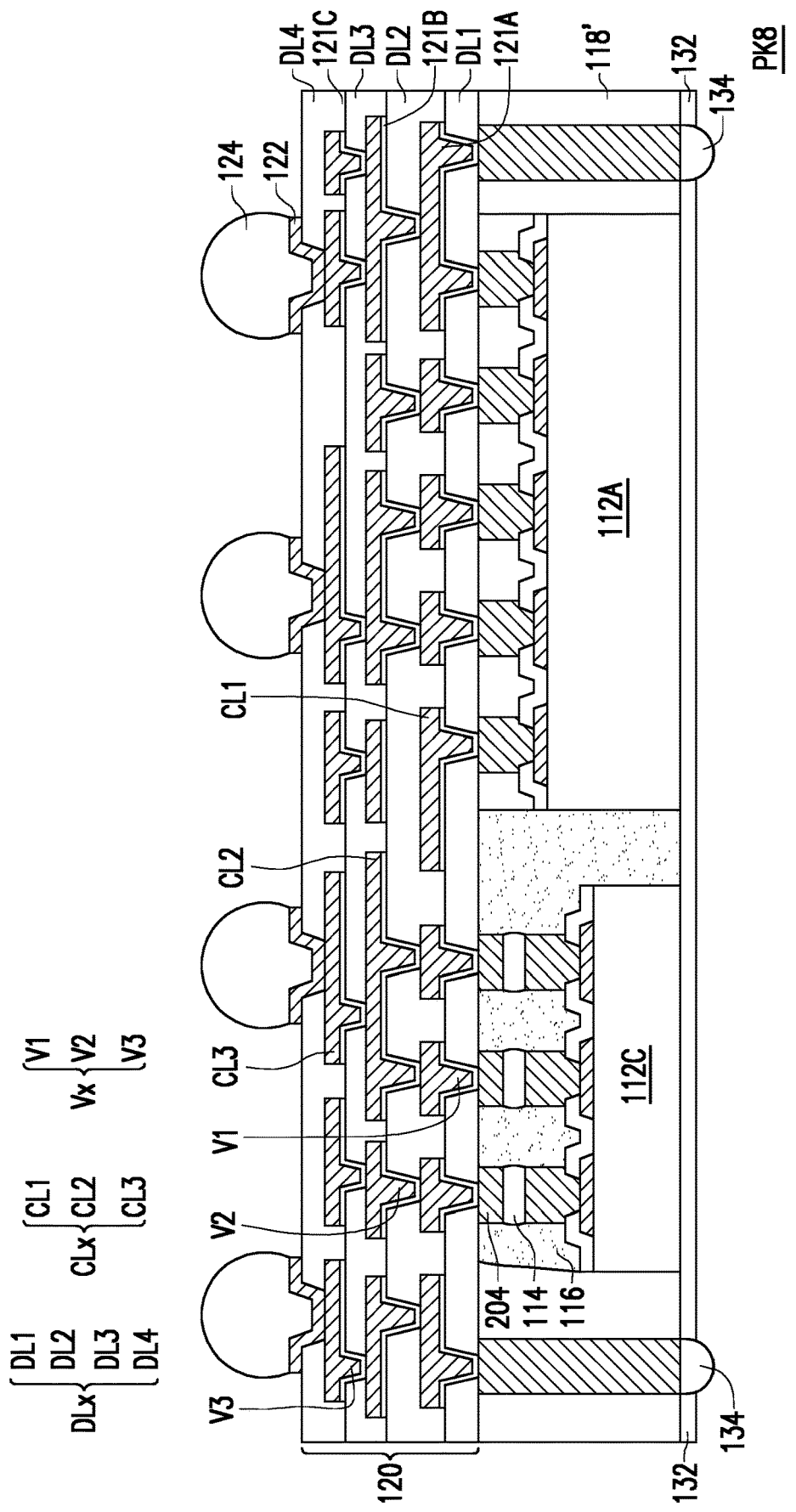
FIG. 8 is a schematic sectional view of a package structure according to some other exemplary embodiments of the present disclosure.

FIG. 8 is a schematic sectional view of a package structure according to some other exemplary embodiments of the present disclosure. The package structure PK8 illustrated in FIG. 8 is similar to the package structure PK7 illustrated in FIG. 7H, hence the same reference numerals are used to refer to the same or liked parts, and its detailed description will be omitted herein. The difference between the embodiments is in that through insulator vias are further provided in the package structure PK8.

As illustrated in FIG. 8, in some embodiments, the package structure PK8 further includes through insulator vias 130 that are surrounding the first semiconductor die 112A and the semiconductor die 112C. In some embodiments, the through insulator vias 130 is embedded in the insulating encapsulant 118' and being electrically connected to the redistribution layer 120. In one embodiment, the material of the through insulator vias 130 may include a metal material such as copper or copper alloys, or the like. However, the disclosure is not limited thereto.

Furthermore, in some embodiments, a dielectric layer 132 is disposed on a backside surface of the insulating encapsulant 118' opposite to where the redistribution layer 120 is located. In certain embodiments, the dielectric layer 132 has openings that reveal the through insulator vias 130, whereas conductive terminals 134 are further disposed in the openings of the dielectric layer 132 and connected to the through insulator vias 130. Up to here, the package structure PK8 having dual side terminals is accomplished.

In the above-mentioned embodiments, since the semiconductor dies are bonded onto the plurality of connecting elements located at a front side of the insulating encapsulant, and the grinding or planarization process is performed on backsides of the insulating encapsulant and the semiconductor dies, cracks in the insulating encapsulant 118' and cracks in the redistribution layer 120 may be further reduced. In addition, since a plurality of connecting pillars are used to compensate for the die height variation, molding and grinding on the conductive posts of the semiconductor dies may be reduced. As a result, cracks in the molding compound (encapsulant) and cracks in the redistribution layer may be further reduced. Overall, semiconductor dies having thickness variations may be efficiently integrated in the package structure, and a package structure having better reliability may be fabricated.

In accordance with some embodiments of the present disclosure, a package structure includes a plurality of semiconductor dies, an insulating encapsulant, a redistribution layer and a plurality of connecting elements. The insulating encapsulant is encapsulating the plurality of semiconductor dies. The redistribution layer is disposed on the insulating encapsulant in a build-up direction and electrically connected to the plurality of semiconductor dies, wherein the redistribution layer includes a plurality of conductive lines, a plurality of conductive vias and a plurality of dielectric layers alternately stacked, and a lateral dimension of the plurality of conductive vias increases along the build-up direction. The connecting elements are disposed in between the redistribution layer and the semiconductor dies, wherein the connecting elements includes a body portion joined with the semiconductor dies and a via portion joined with the redistribution layer, wherein a lateral dimension of the via portion decreases along the build-up direction.

In accordance with some other embodiments of the present disclosure, a package structure includes a first semiconductor die, a second semiconductor die, an underfill structure, an insulating encapsulant, a redistribution layer and a plurality of connecting elements. The first semiconductor die has a plurality of first conductive posts. The second semiconductor die has a plurality of second conductive posts. The underfill structure is covering the plurality of first conductive posts and the plurality of second conductive posts. The insulating encapsulant is encapsulating the first semiconductor die, the second semiconductor die and the underfill structure. The redistribution layer is disposed on the insulating encapsulant and on the underfill structure, wherein the redistribution layer comprises a plurality of conductive lines, a plurality of conductive vias and a plurality of dielectric layers alternately stacked. The plurality of connecting elements is electrically connecting the redistribution layer to the plurality of first conductive posts of the first semiconductor die and to the plurality of second conductive posts of the second semiconductor die, wherein a portion of the plurality of connecting elements is surrounded by the underfill structure, and another portion of the plurality of connecting elements is surrounded by a first dielectric layer of the plurality of dielectric layers.

In accordance with some other embodiments of the present disclosure, a method of fabricating a package structure is described. The method includes the following steps. A first carrier is provided. A first conductive line is formed on the first carrier. A first dielectric layer is formed to cover the first conductive line, wherein the first dielectric layer has a plurality of openings exposing a surface of the first conductive line. A plurality of connecting elements is formed on the first dielectric layer and in the plurality of openings, wherein the plurality of connecting elements comprises a body portion and a via portion, the via portion is joined with the first conductive line, and a lateral dimension of the via portion decreases along a first direction of the package structure. A plurality of semiconductor dies is disposed on the body portion of the plurality of connecting elements. An insulating encapsulant is formed to encapsulate the plurality of semiconductor dies and the plurality of connecting elements. The first carrier is de-bonded, and the package structure is transferred onto a second carrier. A plurality of conductive lines, a plurality of conductive vias and a plurality of dielectric layers are formed to be alternately stacked over the first conductive line and the first dielectric layer to constitute a redistribution layer, wherein a lateral dimension of the plurality of conductive vias increases along the first direction of the package structure.

In accordance with yet another embodiment of the present disclosure, a package structure includes a first semiconductor die, a second semiconductor die, a plurality of connecting pillars, an insulating encapsulant and a redistribution layer. The first semiconductor die has a plurality of first conductive posts. The second semiconductor die has a plurality of second conductive posts, wherein a height of the second semiconductor die is smaller than a height of the first semiconductor die. The plurality of connecting pillars is joined with the plurality of second conductive posts of the second semiconductor die, wherein a top surface of the plurality of connecting pillars is coplanar with a top surface of the plurality of first conductive posts. The insulating encapsulant is encapsulating the first semiconductor die, the second semiconductor die, and the plurality of connecting pillars. The redistribution layer is disposed on the insulating encapsulant and electrically connected to the plurality of first conductive posts and the plurality of connecting pillars.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a package structure, comprising:
    providing a first carrier;
    forming a first conductive line on the first carrier;
    forming a first dielectric layer covering the first conductive line, wherein the first dielectric layer has a plurality of openings exposing a surface of the first conductive line;
    forming a plurality of connecting elements on the first dielectric layer and in the plurality of openings, wherein the plurality of connecting elements comprises a body portion and a via portion, the via portion is joined with the first conductive line, and a lateral dimension of the via portion decreases along a first direction of the package structure;
    disposing a plurality of semiconductor dies on the body portion of the plurality of connecting elements;
    forming an insulating encapsulant to encapsulate the plurality of semiconductor dies and the plurality of connecting elements;
    de-bonding the first carrier and transferring the package structure onto a second carrier; and
    forming a plurality of conductive lines, a plurality of conductive vias and a plurality of dielectric layers alternately stacked over the first conductive line and the first dielectric layer to constitute a redistribution layer, wherein a lateral dimension of the plurality of conductive vias increases along the first direction of the package structure.

2. The method of fabricating the package structure according to claim 1, wherein after forming the insulating encapsulant, a planarization process is performed on backsides of the insulating encapsulant and the plurality of semiconductor die to form coplanar surfaces.

3. The method of fabricating the package structure according to claim 1, further comprising:
    forming a planar seed layer on the first carrier prior to forming the first conductive line;
    forming the first conductive line on the planar seed layer over the first carrier; and
    forming the first dielectric layer covering the first conductive line and the planar seed layer.

4. The method of fabricating the package structure according to claim 3, wherein the planar seed layer is completely removed after transferring the package structure onto the second carrier.

5. The method of fabricating the package structure according to claim 3, wherein the plurality of conductive vias are formed to be electrically connected to the planar seed layer.

6. The method of fabricating the package structure according to claim 1, further comprising:
    forming an underfill structure covering the body portions of the plurality of connecting elements, and partially covering the plurality of semiconductor dies; and
    forming the insulating encapsulant to encapsulate the underfill structure, the plurality of semiconductor dies and the plurality of connecting elements.

7. The method of fabricating the package structure according to claim 1, further comprising:
    forming a connecting seed layer on the first dielectric layer and in the plurality of openings prior to forming the plurality of connecting elements; and
    forming the plurality of connecting elements over the connecting seed layer, wherein the via portion of the plurality of connecting elements has tapered sidewalls, the lateral dimension between the tapered sidewalls of the via portion decreases along a first direction of the package structure, and the connecting seed layer is covering the tapered sidewalls of the via portion.

8. The method of fabricating the package structure according to claim 1, wherein the plurality of semiconductor dies is disposed on the body portion of the plurality of connecting elements by joining conductive posts of the plurality of semiconductor dies to the body portion of the plurality of connecting elements using a plurality of conductive bumps.

9. A method of fabricating a package structure, comprising:
   forming a plurality of connecting elements over a first carrier;
   bonding a first semiconductor die having a plurality of first conducive posts to the plurality of connecting elements;
   bonding a second semiconductor die having a plurality of second conductive posts to the plurality of connecting elements, wherein a height of the second semiconductor die is smaller than a height of the first semiconductor die;
   forming an insulating material encapsulating the first semiconductor die, the second semiconductor die and the plurality of connecting elements;
   performing a planarization process by removing portions of the insulating material to reveal backside surfaces of the first semiconductor die and the second semiconductor die;
   debonding the first carrier, and transferring the package structure onto a second carrier; and
   forming a redistribution layer disposed on and electrically connected to the plurality of connecting elements.

10. The method of fabricating the package structure according to claim 9, wherein the plurality of first conducive posts is bonded to the plurality of connecting elements via a plurality of conductive bumps, and the plurality of second conductive posts is bonded to the plurality of connecting elements via the plurality of conductive bumps.

11. The method of fabricating the package structure according to claim 9, further comprising:
   forming a planar seed layer and a first conductive line over the first carrier prior to forming the plurality of connecting elements, wherein the first conductive line is formed above the planar seed layer; and
   forming the plurality of connecting elements on the first conductive line.

12. The method of fabricating the package structure according to claim 11, wherein forming the redistribution layer comprises completely removing the planar seed layer, and forming a plurality of conductive lines, a plurality of conductive vias and a plurality of dielectric layers alternately stacked over the first conductive line.

13. The method of fabricating the package structure according to claim 11, wherein forming the redistribution layer comprises forming a plurality of conductive lines, a plurality of conductive vias and a plurality of dielectric layers alternately stacked over the planar seed layer.

14. The method of fabricating the package structure according to claim 9, wherein the planarization process further removes a portion of the first semiconductor die, and after the planarization process, the height of the second semiconductor die is substantially equal to the height of the first semiconductor die.

15. The method of fabricating the package structure according to claim 9, further comprising forming an underfill structure covering the plurality of connecting elements and partially covering the first semiconductor die and the second semiconductor die.

16. A method of fabricating a package structure, comprising:
   forming a first conductive line on a carrier;
   forming a plurality of connecting elements disposed on and electrically connected to the first conductive line;
   providing a plurality of semiconductor dies having conductive posts, and bonding the plurality of semiconductor dies to the plurality of connecting elements by flip-chip bonding, wherein the conductive posts are bonded to the plurality of connecting elements through a plurality of conducive bumps;
   forming an underfill structure covering the conductive posts, the plurality of connecting elements and the plurality of conductive bumps;
   debonding the carrier; and
   forming a plurality of conductive lines and a plurality of conductive vias disposed on and electrically connected to the first conductive line.

17. The method of fabricating the package structure according to claim 16, further comprising an insulating encapsulant encapsulating the plurality of semiconductor dies and the underfill structure.

18. The method of fabricating the package structure according to claim 16, further comprising forming a connecting seed layer on the first conductive line prior to forming the plurality of connecting elements, and forming the plurality of connecting elements on the connecting seed layer.

19. The method of fabricating the package structure according to claim 18, wherein after debonding the carrier, a non-planar seed layer is formed over the first conductive line prior to forming the plurality of conductive lines and the plurality of conductive vias, and wherein the plurality of conductive lines and the plurality of conductive vias are formed over the non-planar seed layer and electrically connected to the first conductive line through the non-planar seed layer, and the first conductive line is sandwiched in between the connecting seed layer and the non-planar seed layer.

20. The method of fabricating the package structure according to claim 16, further comprising:
   forming a planar seed layer on the carrier prior to forming the first conductive line;
   forming the first conductive line on the planar seed layer; and
   after debonding the carrier, forming the plurality of conductive lines and the plurality of conductive vias on the planar seed layer.

* * * * *